United States Patent
Ishida et al.

(10) Patent No.: US 6,977,550 B2
(45) Date of Patent: Dec. 20, 2005

(54) AGC CIRCUIT

(75) Inventors: Takuma Ishida, Takatsuki (JP); Taku Kobayashi, Suita (JP); Keiichi Fujii, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 23 days.

(21) Appl. No.: 10/713,274

(22) Filed: Nov. 17, 2003

(65) Prior Publication Data

US 2004/0178851 A1    Sep. 16, 2004

(30) Foreign Application Priority Data

Mar. 11, 2003  (JP)  ............... 2003-064980

(51) Int. Cl.$^7$ ............................... H03G 3/30
(52) U.S. Cl. ..................... 330/279; 330/129
(58) Field of Search ................. 330/279, 129

(56) References Cited

U.S. PATENT DOCUMENTS

| | | | | |
|---|---|---|---|---|
| 5,566,363 A | * | 10/1996 | Senda | 330/129 |
| 5,606,284 A | | 2/1997 | Tamesue et al. | 330/129 |
| 5,752,171 A | * | 5/1998 | Akiya | 330/279 |
| 6,038,432 A | * | 3/2000 | Onoda | 455/127.2 |
| 6,057,732 A | * | 5/2000 | Morishita | 330/129 |

FOREIGN PATENT DOCUMENTS

| | | |
|---|---|---|
| JP | 08116226 | 5/1996 |
| JP | 2901899 | 3/1999 |

* cited by examiner

*Primary Examiner*—Khanh V. Nguyen
(74) *Attorney, Agent, or Firm*—Stevens, Davis, Miller & Mosher, LLP

(57) ABSTRACT

An AGC circuit, which does not require any signal integration circuit comprised of a capacitor and a resistor, is provided. To achieve the above object, when amplifying or attenuating input signal by a variable gain control circuit controlled by the gain control voltage, output signal of the variable gain amplifier circuit is rectified by a rectification circuit, the output signal of the rectification circuit is compared to an arbitrary set voltage by a voltage comparator. The up-count operation and the down-count operation of the up/down counter is controlled to changeover by the output signal of the voltage comparator, and a voltage corresponding to the count value of the up/down counter is output from the D/A conversion circuit. Thus, gain control voltage corresponding to the voltage output from the D/A conversion circuit is supplied to the variable gain amplifier circuit.

12 Claims, 17 Drawing Sheets

AGC CIRCUIT

BACKGROUND OF THE INVENTION

1. Field of the Invention

The present invention relates to an AGC circuit that, in a communication system or audio system, controls the gain of a variable gain amplifier circuit in accordance with the amplitude of input signal so that the amplitude of output signal is kept at a specific level and thereby restricts the fluctuation in the input signal.

2. Description of the Related Art

As a related art of the AGC circuit, a proposal is disclosed in Japanese Patent No. 2901899.

FIG. 17 shows the AGC circuit according to the related art set forth in the above Japanese Patent No. 2901899. In FIG. 17, reference numeral A1 denotes a signal input terminal to which an input signal VA is supplied. Reference numeral 31 denotes a variable gain amplifier circuit that amplifies or attenuates the input signal VA in accordance with the gain, which is controlled by a gain control voltage V33, and outputs an output signal VB. Reference numeral B1 denotes an output terminal of the variable gain amplifier circuit 31.

Reference numeral 32 denotes a rectification circuit that rectifies an output voltage of the variable gain amplifier circuit 31. Reference numeral 33 denotes a signal integration circuit that integrates the voltage rectified by the rectification circuit 32 into a D.C. voltage. Reference numeral 34 denotes a resistor constituting the signal integration circuit 33. Reference numeral 35 denotes a capacitor constituting the signal integration circuit 33.

Reference numeral 36 denotes a D.C. amplifier circuit that outputs a voltage proportional to a difference between the D.C. voltage V31, which is input from the signal integration circuit 33, and a reference voltage V32 as again control voltage V33. Reference numeral 37 denotes a reference voltage input terminal of the D.C. amplifier circuit 36. The gain control voltage V33 controls the gain of the variable gain amplifier circuit 31, which is an output voltage of the D.C. amplifier circuit 36.

In FIG. 17, a reference voltage circuit and a voltage control switch of the D.C. amplifier circuit 36 and a circuit, which switches the AGC circuit between ON and OFF, are omitted.

Reference voltage to be given to the D.C. amplifier circuit 36 is generated by a resistance-dividing network. A MOS transistor is connected to the output section of the resistance-dividing network. The AGC characteristics are changed by ON/OFF operation of the MOS transistor to change the value of the reference voltage. The MOS transistor is call as voltage control switch.

The operation of the above-described AGC circuit according to the related art, will be described below with reference to the drawing.

The input signal VA, which is input from the input terminal A1, is amplified or attenuated by the variable gain amplifier circuit 31 and output from the output terminal B1 as the output signal VB. The output signal VB is converted into the D.C. voltage V31 corresponding to the magnitude (amplitude) thereof by the rectification circuit 32 and the signal integration circuit 33. The D.C. voltage V31 is further input into the D.C. amplifier circuit 36.

The D.C. amplifier circuit 36 outputs a voltage proportional to the difference between the D.C. voltage V31 and the reference voltage V32 as the gain control voltage V33. The gain control voltage V33 is given to the variable gain amplifier circuit 31.

The AGC circuit is adapted so that, when the amplitude of the input signal VA is large, the gain of the variable gain amplifier circuit 31 is lowered; when the amplitude of the input signal VA is small, the gain of the variable gain amplifier circuit 31 is raised. Accordingly, by repeating the above operation, the output signal VB is converged into a specific amplitude level. The level can be previously determined from the relationship among the D.C. voltage V31, the reference voltage V32 and the gain control signal voltage V33 or the gain of the variable gain amplifier circuit 31.

According to the related art, the response time of the AGC, i.e., the attack time and the recovery time is determined by selecting the capacitance value of an external capacitor. For example, when the capacitance value of the external capacitor is 0.47 $\mu$F, the attack time is approximately 1 msec; and the recovery time is approximately 1 sec.

However, in the related art of the AGC circuit, it is necessary to convert the output signal VB of the variable gain amplifier circuit 31 into the D.C. voltage V31 by integrating the rectified signal which has been rectified by the rectification circuit 32.

However, to achieve the above, a time constant for the integration operation, which depends on the resistance value of the resistor 34 and the capacitance value of the capacitor 35 constituting the signal integration circuit 33, has to be set to be large enough with respect to the minimum frequency of the analog signal as the input signal VA. As a result, there resides such problem that, generally, the capacitance value of the capacitor 35 becomes an extremely large value, which is impossible to be integrated within a semiconductor integrated circuit.

SUMMARY OF THE INVENTION

An object of the invention is to provide an AGC circuit which is easy to be incorporated in integrated circuits without requiring any signal integration circuit using a capacitor.

An AGC circuit of a first aspect of the invention includes a variable gain amplifier circuit having a gain controlled by a gain control signal, a rectification circuit that rectifies an output signal of the variable gain amplifier circuit, a first voltage comparator that compares a rectified signal rectified by the rectification circuit with an arbitrarily preset voltage, a first up/down counter that switches between the up-count operation and the down-count operation in accordance with the level of the output voltage of the first voltage comparator, and a first D/A conversion circuit that outputs a voltage corresponding to the count value of the first up/down counter.

And it is adapted so that a gain control signal corresponding to the voltage output from the first D/A conversion circuit is supplied to the variable gain amplifier circuit.

Owing to this configuration, the rectified signal, which is rectified the output signal of the variable gain amplifier circuit, is compared with preset arbitrary voltage, the up-count operation and the down-count operation of the up/down counter are switched to each other, in accordance with the comparison result, and the gain control signal corresponding to the count value of the up/down counter is fed back to the gain control amplifier. Thereby the amplitude of the output signal of the variable gain amplifier circuit is stabilized irrespective to the fluctuation of the amplitude of the input signal to the variable gain amplifier circuit. In this operation, the up-count operation and down-count operation of the up/down counter provides the same function as the charge/discharge operation of a capacitor. Accordingly, the AGC circuit does not require any signal integration circuit using a capacitor and is easy to be included in integrated circuits. Further, it is possible to adjust the attack time and the recovery time easily.

Also, in the AGC circuit according to the first aspect of the invention, it is preferred that a first up-count operation clock and a first down-count operation clock are input separately into the first up/down counter.

Owing to this configuration, since the first up-count operation clock and the first down-count operation clock are separately input into the first up/down counter, the count up speed and the count down speed of the up/down counter can be changed separately. Accordingly, the attack time and the recovery time can be adjusted separately.

Further, in the AGC circuit according to the first aspect of the invention, it is preferred that a first register is provided between the first voltage comparator and the first up/down counter, the output voltage of the first voltage comparator is stored in the first register at a cycle of a first reference clock, the up-count operation and the down-count operation of the first up/down counter is switched in accordance with the level of the voltage stored in the first register, thereby it is adapted so that any changes of the output voltage of the first voltage comparator within a period shorter than the cycle of the first reference clock is not transmitted to the first up/down counter.

Owing to this configuration, since a first register is provided, it is possible to prevent the changes of the output voltage of the first voltage comparator within a period shorter than the cycle of the first reference clock from being transmitted to the first up/down counter. Accordingly, a further precise AGC circuit, which does not follow the changes of the input signal in a period of time shorter than the preset output response to the changes of an input signal level, can be provided.

Furthermore, in the AGC circuit according to the first aspect of the invention, it is preferred that a first count operation control circuit is provided between the first voltage comparator and the first up/down counter, the output voltage of the first voltage comparator is transmitted to the first up/down counter or the transmission thereof is shut down in accordance with the count value of the first up/down counter by the first count operation control circuit, and thereby the count value of the first up/down counter is restricted within a range from a predetermined first upper limit value to a predetermined first lower limit value.

Owing to this configuration, the count value of the first up/down counter can be restricted within a range from the predetermined first upper limit value to the predetermined first lower limit value by the first count operation control circuit. Accordingly, a further eminent AGC circuit, which prevents the overflow of the up/down counter and is capable of arbitrarily setting the gain variation range of the variable gain amplifier circuit, can be provided.

Still further, in the AGC circuit according to the first aspect of the invention, it is preferred that a first register is provided and a first count operation control circuit is provided between the first register and the first up/down counter, the output voltage of the first register is transmitted to the first up/down counter or the transmission thereof is shut down in accordance with the count value of the first up/down counter by the first count operation control circuit, and thereby the count value of the first up/down counter is restricted within a range from a predetermined first upper limit value to a predetermined first lower limit value.

Owing to this configuration, the count value of the first up/down counter can be restricted within a range from the predetermined first upper limit value to the predetermined first low r limit value by the first count operation control circuit. Accordingly, a further eminent AGC circuit, which prevents the overflow of the up/down counter and is capable of arbitrarily setting the gain variation range of the variable gain amplifier circuit, can be provided.

Still furthermore, in the AGC circuit according to the first aspect of the invention, it is preferred that the first up/down counter has a function to execute the up-count operation or to stop the execution thereof in accordance with the count value, and to execute the down-count operation or to stop the execution thereof in accordance with the count value, thereby the count value is restricted within a range from a predetermined first upper limit value and a predetermined first lower limit value.

Owing to this configuration, the count value of the first up/down counter itself can be restricted within a range from the predetermined first upper limit value to the predetermined first lower limit value by up/ down counter. Accordingly, a further eminent AGC circuit, which prevents the overflow of the up/down counter and is capable of arbitrarily setting the gain variation range of the variable gain amplifier circuit, can be provided.

The AGC circuit according to a second aspect of the invention includes a variable gain amplifier circuit having a gain controlled by a gain control signal, a rectification circuit that rectifies an output signal of the variable gain amplifier circuit, a first voltage comparator that compares a rectified signal rectified by the rectification circuit with an arbitrarily preset voltage, a first up/down counter that switches between the up-count operation and the down-count operation in accordance with the level of the output voltage of the first voltage comparator, a first D/A conversion circuit that outputs a voltage corresponding to the count value of the first up/down counter, a second up/down counter, a second D/A conversion circuit that outputs a voltage corresponding to the count value of the second up/down counter, a second voltage comparator that compares the output voltage of the first D/A conversion circuit with the output voltage of the second D/A conversion circuit, and a changeover circuit that outputs the higher output voltage of the output voltage of the first D/A conversion circuit and the output voltage of the second D/A conversion circuit based on the level of the output voltage of the second voltage comparator.

And it is adapted so as to switch between the up-count operation and the down-count operation of the second up/down counter according to the level of the output voltage of the second voltage comparator, thereby a gain control signal corresponding to the voltage output from the changeover circuit is supplied to the variable gain amplifier circuit.

Owing to this configuration, the rectified signal, which is rectified output signal of the variable gain amplifier circuit, is compared with the preset arbitrary voltage, the up-count operation and the down-count operation of the up/down counter are switched to each other in accordance with the comparison result, gain control signal corresponding to the count value of the up/down counter is fed back to the gain control amplifier. Owing to this arrangement, the amplitude of the output signal of the variable gain amplifier circuit is stabilized irrespective to fluctuation of the amplitude of the input signal to the variable gain amplifier circuit. In this operation, the up-count operation and the down-count operation of the up/down counter perform the same function as the charge/discharge operation of a capacitor. Accordingly, the AGC circuit can be included in integrated circuits without requiring any signal integration circuit using a capacitor.

Further, an eminent AGC circuit, of which attack time and recovery time can be adjusted easily.

Further, the second up/down counter, the second D/A conversion circuit, the second voltage comparator and the changeover circuit are provided, and thereby the output voltages of the first and second D/A conversion circuits are compared. Based on the comparison result, the up-count operation and the down-count operation of the second up/down counter are switched to each other. The higher output voltage of the first and the second D/A conversion circuit is fed back to the gain control amplifier as the gain control signal by the changeover circuit. Owing to this arrangement, the output voltages of the first and the second D/A conversion circuit can be selected in accordance with the changes of the input signal. As a result, it is possible to change the response of the gain control signal in accordance with the changes of the input signal. Accordingly, for example, when the AGC circuit is used for processing audio signal, it is possible to provide audio signal without uncomfortable feeling with respect to a series of input plural signals.

In the AGC circuit according to the second aspect of the invention, it is preferred that a first up-count operation clock and a first down-count operation clock are input separately into the first up/down counter, and a second up-count operation clock and a second down-count operation clock are input separately into the second up/down counter.

Owing to this configuration, since the first up-count operation clock and the first down-count operation clock are separately input into the first up/down counter and the second up-count operation clock and the second down-count operation clock are separately input into the second up/down counter, the count up speed and the count down speed of the respective up/down counters can be separately changed. Accordingly, the attack time and the recovery time can be adjusted separately.

Also, in the AGC circuit according to the second aspect of the invention, it is preferred that a first register is provided between the first voltage comparator and the first up/down counter, the output voltage of the first voltage comparator is stored in the first register at a cycle of a first reference clock, the up-count operation and the down-count operation of the first up/down counter is switched in accordance with the level of the voltage stored in the first register, and it is adapted so that any changes of the output voltage of the first voltage comparator within a period shorter than the cycle of the first reference clock is not transmitted to the first up/down counter.

Owing to this configuration, since the first register is provided, it is possible to prevent the changes of the output voltage of the first voltage comparator within a period shorter than the cycle of the first reference clock from being transmitted to the first up/down counter. Accordingly, it is possible to provide a further precise AGC circuit, which does not follow the level changes of the input signal in a period of time shorter than the preset output response to the level changes of an input signal.

Further, in the AGC circuit according to the second aspect of the invention, it is preferred that a first register is provided, and a second register is provided between the second voltage comparator and the second up/down counter and the changeover circuit, the output voltage of the second voltage comparator is stored in the second register at a cycle of a second reference clock, the up-count operation and the down-count operation of the second up/down counter is switched in accordance with the level of the voltage stored in the second register, and it is adapted so that any changes of the output voltage of the second voltage comparator within a period shorter than the cycle of the second reference clock is not transmitted to the second up/down counter.

Owing to this configuration, since the second register is provided, it is possible to prevent the changes of the output voltage of the second voltage comparator within a period shorter than the cycle of the second reference clock from being transmitted to the up/down operation control terminal of the second up/down counter. Accordingly, since both of the operations of the changeover circuit and the up/down counters are stabilized and the operation of the variable gain amplifier circuit is stabilized, it is possible to provide a further eminent AGC circuit.

Furthermore, in the AGC circuit according to the second aspect of the invention, it is preferred that a first count operation control circuit is provided between the first voltage comparator and the first up/down counter, the output voltage of the first voltage comparator is transmitted to the first up/down counter or the transmission thereof is shut down in accordance with the count value of the first up/down counter by the first count operation control circuit, and thereby the count value of the first up/down counter is restricted within a range from a predetermined first upper limit value to a predetermined first lower limit value. And it is preferred that a second count operation control circuit is provided between the second voltage comparator and the second up/down counter, the output voltage of the second voltage comparator is transmitted to the second up/down counter or the transmission thereof is shut down in accordance with the count value of the second up/down counter by the second count operation control circuit, and thereby the count value of the second up/down counter is restricted within a range from a predetermined second upper limit value to a predetermined second lower limit value.

Owing to this configuration, the count value of the first up/down counter can be restricted within a range from the predetermined first upper limit value to the predetermined first lower limit value by the first count operation control circuit. Also, the count value of the second up/down counter can be restricted within a range from the predetermined second upper limit value to the predetermined second lower limit value by the second count operation control circuit. Accordingly, a further eminent AGC circuit, which prevents the overflow of the up/down counter and is capable of arbitrarily setting the gain variation range of the variable gain amplifier circuit, can be provided.

Still further, in the AGC circuit according to the second aspect of the invention, it is preferred that first and second registers are provided, and a first count operation control circuit is provided between the first register and the first up/down counter, the output voltage of the first register is transmitted to the first up/down counter or the transmission thereof is shut down in accordance with the count value of the first up/down counter by the first count operation control circuit, and thereby the count value of the first up/down counter is restricted within a range from a predetermined first upper limit value to a predetermined first lower limit value. And it is preferred that a second count operation control circuit is provided between the second register and the second up/down counter, the output voltage of the second register is transmitted to the second up/down counter or the transmission thereof is shut down in accordance with the count value of the second up/down counter by the second count operation control circuit, and thereby the count value of the second up/down counter is restricted within a range from a predetermined second upper limit value to a predetermined second lower limit value.

Owing to this configuration, the count value of the first up/down counter can be restricted within a range from the predetermined first upper limit value to the predetermined first lower limit value by the first count operation control circuit. Also, the count value of the second up/down counter can be restrict d within a range from the predetermined second upper limit value to the predetermined second lower limit value by the second count operation control circuit. Accordingly, a further eminent AGC circuit, which prevents the overflow of the up/down counter and is capable of arbitrarily setting the gain variation range of the variable gain amplifier circuit, can be provided.

Still furthermore, in the AGC circuit according to the second aspect of the invention, it is preferred that the first up/down counter has a function to execute the up-count operation or to stop the execution thereof in accordance with the count value, and to execute the down-count operation or to stop the execution thereof in accordance with the count value, thereby to restrict the count value within a range from a predetermined first upper limit value and a predetermined first lower limit value. And it is preferred that the second up/down counter has a function to execute the up-count operation or to stop the execution thereof in accordance with the count value, and to execute the down-count operation or to stop the execution thereof in accordance with the count value, thereby to restrict the count value within a range from a predetermined second upper limit value and a predetermined second lower limit value.

Owing to this configuration, the count value of the first up/down counter can be restricted within a range from the predetermined first upper limit value to the predetermined first lower limit value by the first up/down counter. Also, the count value of the second up/down counter can be restricted within a range from the predetermined second upper limit value to the predetermined second lower limit value by the second up/down counter. Accordingly, a further eminent AGC circuit, which prevents the overflow of the up/down counter and is capable of arbitrarily setting the gain variation range of the variable gain amplifier circuit, can be provided.

DETAILED DESCRIPTION OF THE PREFERRED EMBODIMENT

Figure 1:
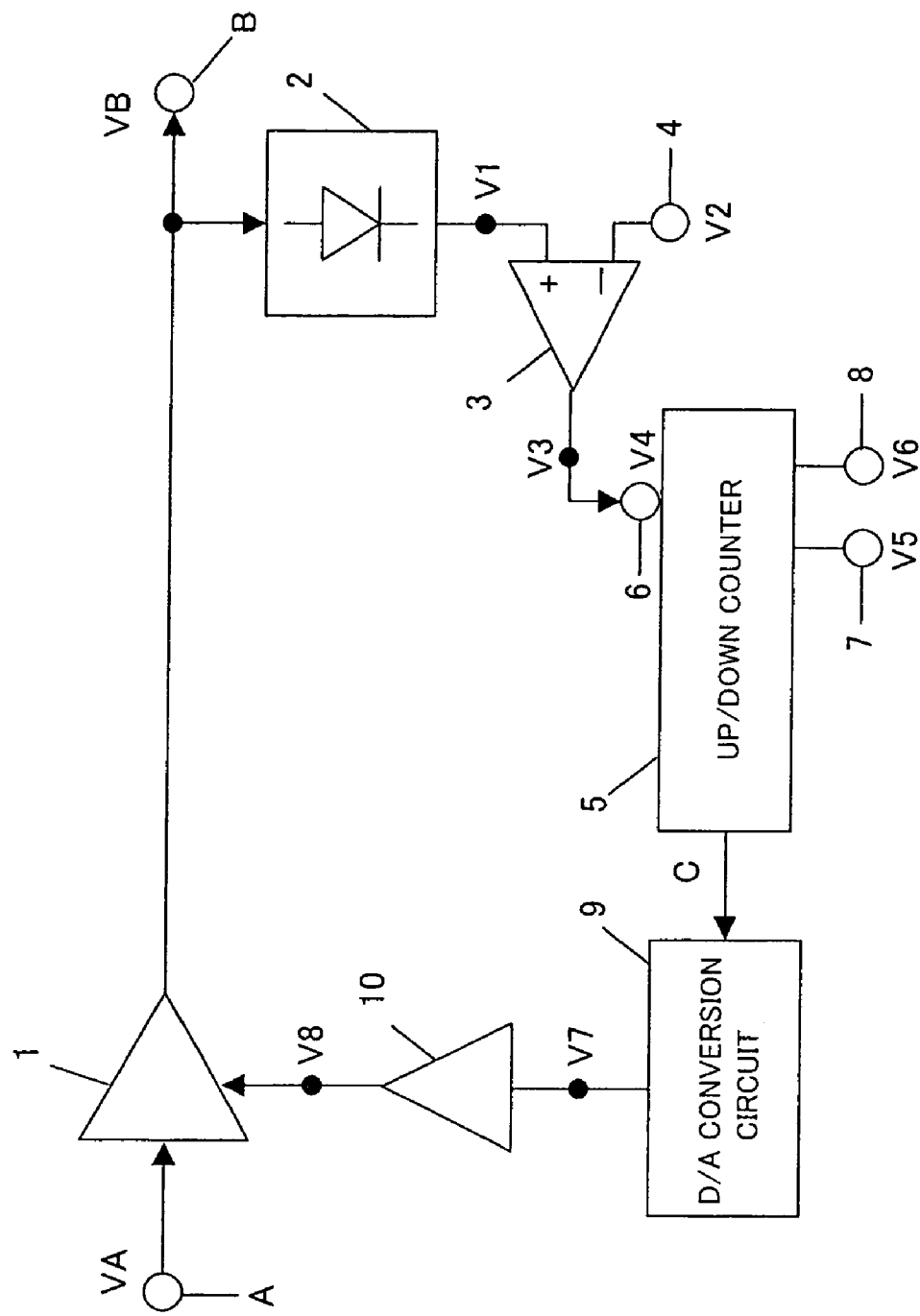
FIG. 1 is a block diagram showing the configuration of an AGC circuit according to a first embodiment of the invention.

Now, referring to the drawings, embodiments of the present invention will be described.

(First Embodiment)

FIG. 1 is a block diagram showing the configuration of an AGC circuit according to a first embodiment of the invention. In FIG. 1, reference symbol A denotes a signal input terminal supplied with input signal VA. Reference numeral 1 denotes a variable gain amplifier circuit that amplifies or attenuates a voltage of input signal VA in accordance with a gain controlled by a gain control voltage V8 to output an output signal VB. Reference symbol B denotes an output terminal of the variable gain amplifier circuit 1. Reference numeral 2 denotes a rectification circuit that rectifies the output voltage of the variable gain amplifier circuit 1. Hereinafter, the rectification circuit 2 will be described as a full wave rectification circuit. However, a half wave rectification circuit is also applicable.

Reference numeral 3 denotes a first voltage comparator that compares rectified signal (output signal) V1 rectified by the rectification circuit 2 with a preset arbitrary threshold voltage V2, and when the output signal V1 is higher than the threshold voltage V2, outputs a high level voltage V3; and when the output signal V1 is lower than the threshold voltage V2, outputs a low level voltage V3. Reference numeral 4 denotes a threshold voltage input terminal for inputting the threshold voltage V2 to the first voltage comparator 3. Reference numeral 5 denotes a first up/down counter. Reference numeral 6 denotes an up/down operation control input terminal that inputs the output voltage V3 of the first voltage comparator 3 as a control signal V4 to control the up/down operation. Reference numeral 7 denotes an input terminal for inputting an up-count operation clock V5. Reference numeral 8 denotes an input terminal for inputting a down-count operation clock V6.

Reference numeral 9 denotes a first D/A conversion circuit that outputs a D.C. voltage V7 corresponding to a count value C of the first up/down counter 5. Reference numeral 10 denotes a D.C. amplifier circuit that has a random preset gain, and uses a D.C. voltage V7 output by the first D/A conversion circuit 9 as an input signal to output a gain control voltage V8.

In FIG. 1, the rectification circuit 2, voltage comparator 3, up/down counter 5, D/A conversion circuit 9 and D.C. amplifier circuit 10 constitute an analog signal detection circuit that detects analog signal level of the output signal VB at the variable gain amplifier circuit 1. According to the first embodiment, the AGC circuit is structured so that the gain of the variable gain amplifier circuit 1 is controlled in accordance with the output signal of the analog signal level detection circuit. However, the applications of the analog signal level detection circuit is not limited only to the AGC circuit but various applications are possible.

In the above configuration, in the case where the half wave rectification circuit is used in place of the full wave rectification circuit, basically, they can be simply replaced with each other. However, to provide the same response, it is necessary to adjust the threshold level of the voltage comparator and the clock frequency of the up/down counter.

Referring to a waveform chart in FIG. 2, the operation in the first embodiment of the invention, which is constituted as described above, will be described below.

The input signal VA is amplified or attenuated by the variable gain amplifier circuit 1 into the output signal VB. The rectification circuit 2 rectifies the output signal VB into the output signal V1.

Then, the output signal V1 of the rectification circuit 2 is input into the voltage comparator 3. In the voltage comparator 3, the output signal V1 of the rectification circuit 2 and threshold voltage V2 are compared with each other. When the output signal V1 is higher than the threshold voltage V2, a high level voltage is output; when the output signal V1 is lower than the threshold voltage V2, a low level voltage is output as the output signal V3.

The output signal V3 is input into the up/down operation control input terminal 6 of the next up/down counter 5 and used as the control signal V4 of the up-count operation and the down-count operation of the up/down counter 5.

When the control signal (voltage) v4 is in the high level period T1, the up/down counter 5 performs the up-count operation in accordance with the up-count frequency set by the up-count operation clock V5. Also, when the control signal (voltage) v4 is in the low level period T2, the up/down counter 5 performs the down-count operation in accordance with the down-count frequency set by the up-count operation clock V6.

The count value C counted by the up/down counter 5 is input into the D/A conversion circuit 9. The D/A conversion circuit 9 outputs the D.C. voltage V7 corresponding to the count value C of the up/down counter 5. The D.C. voltage V7 is converted into an arbitrary magnitude by the D.C. amplifier circuit 10 and is used as the gain control voltage V8 for the variable gain amplifier circuit 1. The gain of the variable gain amplifier circuit 1 is changed by the gain control voltage V8 and the input signal VA is amplified or attenuated.

According to the first embodiment, as the count value becomes larger, the gain control voltage V8 becomes higher and the gain of the variable gain amplifier circuit 1 becomes lower; on the contrary, as the count value becomes smaller, the gain control voltage V8 becomes lower, and the gain of the variable gain amplifier circuit 1 becomes higher.

Here, an example of the attack time and recovery time in the first embodiment will be described. For example, in the case where the up-count operation frequency is 250 kHz, the attack time is 1 ms. Also, in the case where the down-count operation frequency is 250 Hz, the recovery time is 1 sec. It may be adapted so that the up-count operation frequency and down-count operation frequency is selected using a logic circuit.

Figure 2:
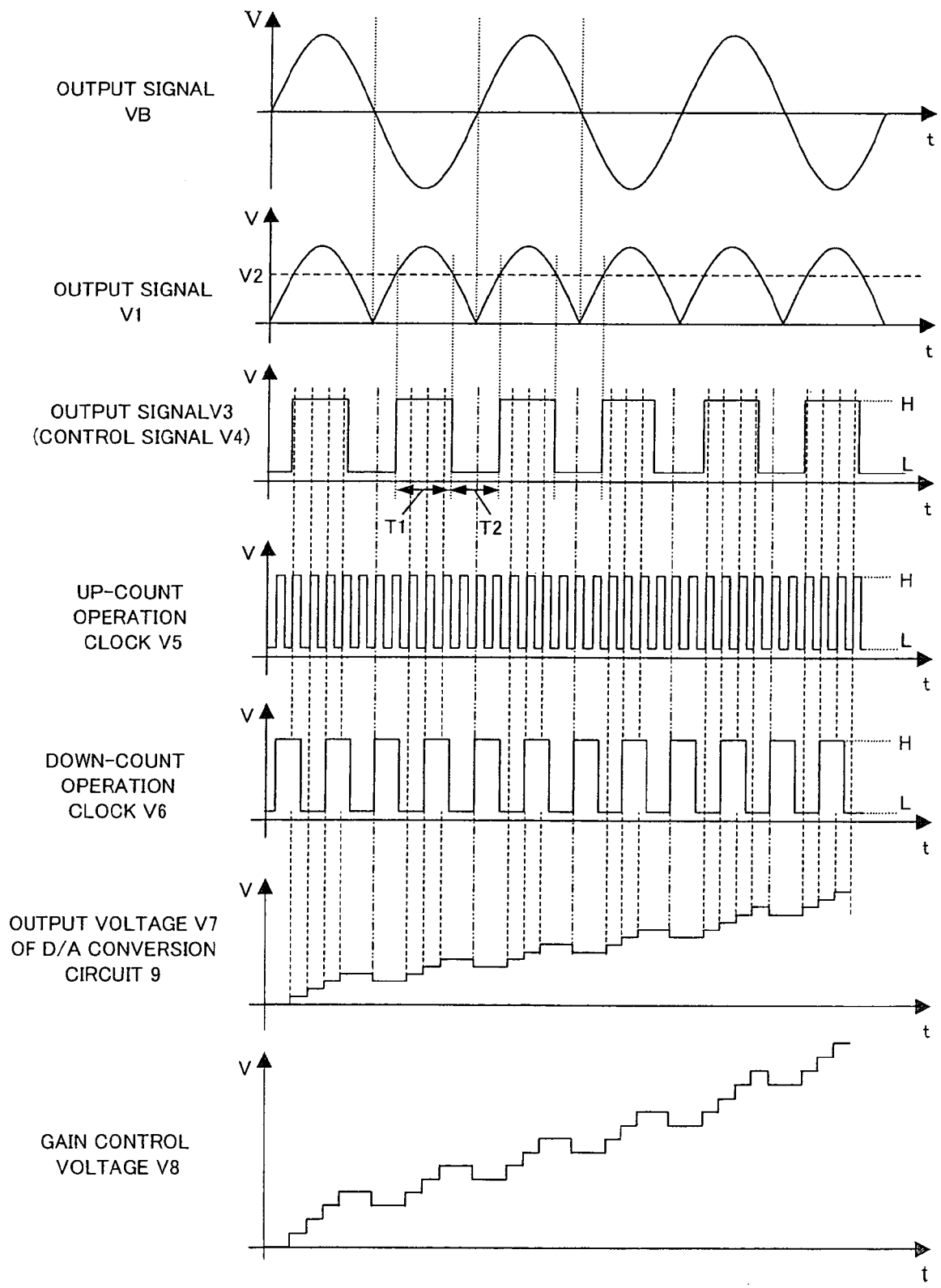
FIG. 2 is a waveform chart illustrating the operation of the AGC circuit shown in FIG. 1.
Figure 3:
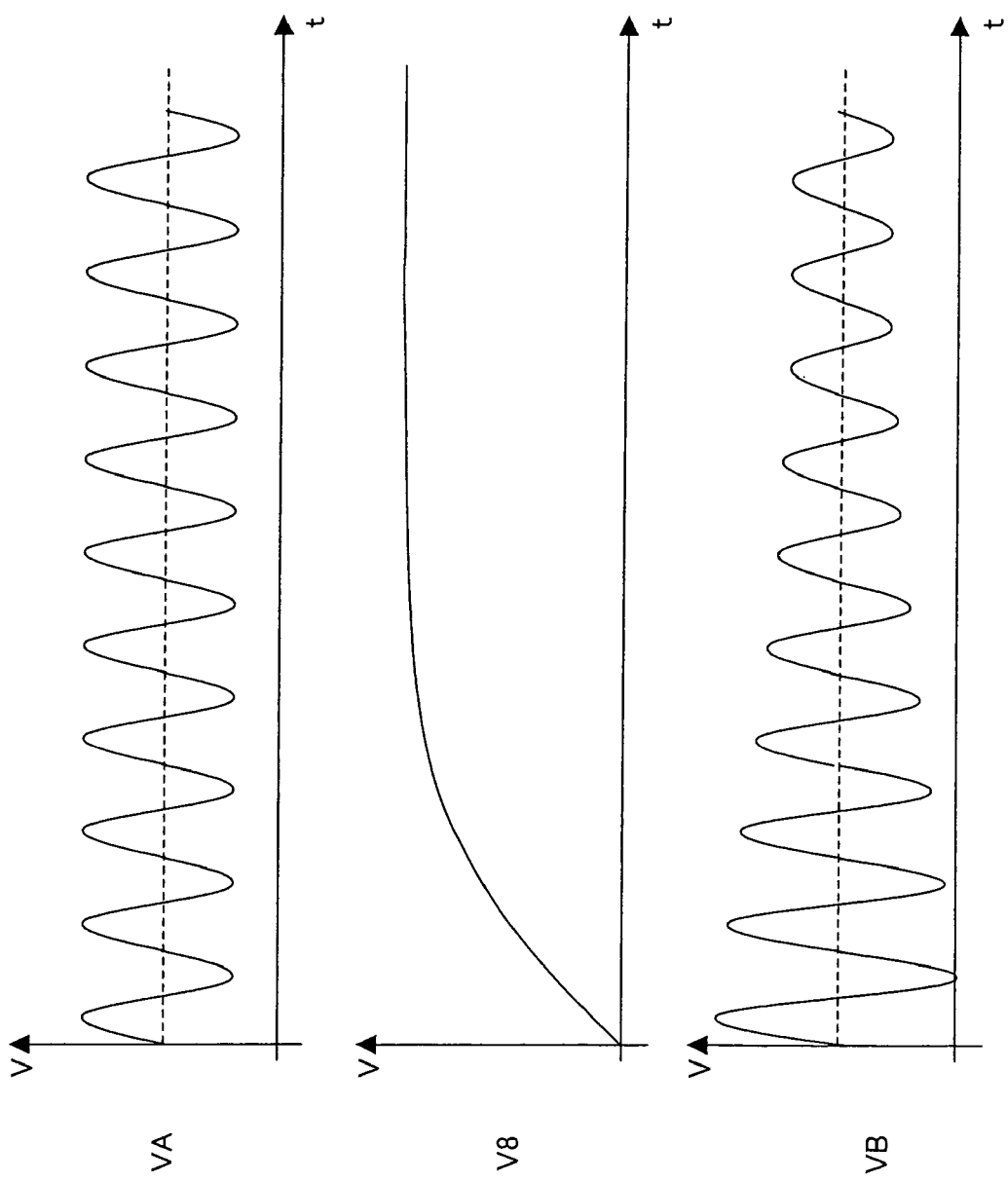
FIG. 3 is also a waveform chart illustrating the operation of the AGC circuit shown in FIG. 1.

FIG. 3 shows waveforms of the input signal VA, control voltage V8 and output signal VB more macroscopically than FIG. 2.

The above operation is repeated up to a point of time when the attenuation of the input signal VA by the up-count and the amplification of the input signal VA by the down-count get balanced; thus, the output voltage VB converges into a specific amplitude level.

Owing to this configuration, it is possible to control the gain of the variable gain amplifier circuit 1 corresponding to the amplitude of the input signal VA so that the amplitude of the output signal is at a constant level without requiring any signal integration circuit using a capacitor; thus the AGC circuit that controls variation in amplitude of the input signal VA is provided. Accordingly, it is easy to incorporate the AGC circuit into an integrated circuit.

Also, by arbitrarily setting the value of the threshold voltage V2 of the voltage comparator 3, the frequency of the up-count operation clock V5 and the down-count operation clock V6 of the up/down counter 5 and the variation range of the gain control voltage corresponding to the count value C, a period of time when the output voltage convergence to a specific amplitude level, i.e., the attack time and recovery time can be adjusted easily. Further, since such configuration that the up-count operation clock V5 and down-count operation clock V6 are separately input into the up/down counter 5 is adopted, the attack time and the recovery time can be adjusted separately.

In the above description, the output voltage V7 of the D/A conversion circuit 9 is input into the D.C. amplifier circuit 10, and the output voltage of the D.C. amplifier circuit 10 is used as the gain control voltage V8. However, it is clear that, even when the output voltage V7 of the D/A conversion circuit 9 is used directly as the gain control signal, the AGC circuit of the invention can be achieved.

Further, in the above, the description is made assuming that the gain control of the variable gain amplifier circuit 1 is the voltage method. The AGC circuit of the invention can be also achieved by changing the form or combination of the outputs D/A conversion circuit 9 and D.C. amplifier circuit 10 in accordance with the gain control method (current type or voltage type) of the variable gain amplifier circuit 1. Accordingly, the gain control signal includes not only the gain control voltage but also the gain control current.

The above-described points are the same in the embodiments described below.

(Second Embodiment)

Figure 4:
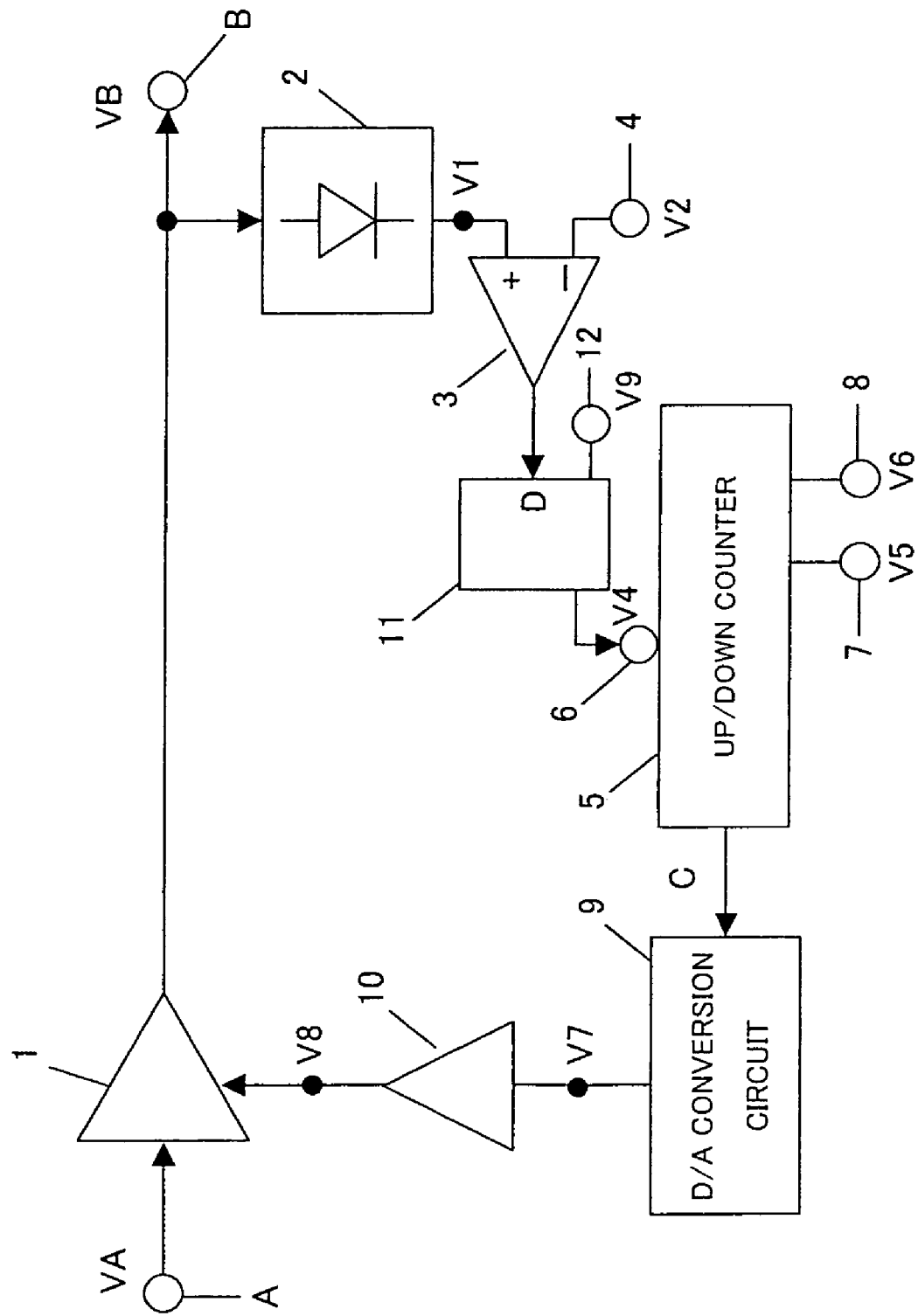
FIG. 4 is a block diagram showing the configuration of an AGC circuit according to a second embodiment of the invention.

FIG. 4 is a block diagram showing the configuration of an AGC circuit of a second embodiment of the invention. In FIG. 4, the constituent elements, which are the same as those in the AGC circuit according to the first embodiment of the invention shown in FIG. 1, will given with the same reference numerals and symbols, and the description thereof will be omitted, and only the elements, which is newly added to the AGC circuit shown in FIG. 1, will be described.

Reference numeral 11 denotes a flip-flop as a register interposed between the first voltage comparator 3 and the up/down operation control input terminal 6 of the up/down counter 5. The flip-flop 11 stores polarity, i.e., voltage level (high level or low level) of a signal output from the first voltage comparator 3 at a cycle of the reference clock V9, and further transmits the polarity stored at the cycle of the reference clock V9 to the up/down operation control input terminal 6 of the first up/down counter 5. Reference numeral 12 denotes a reference clock input terminal for inputting the reference clock V9 into the above flip-flop 11.

In FIG. 4, the rectification circuit 2, voltage comparator 3, flip-flop 11, up/down counter 5, D/A conversion circuit 9 and D.C. amplifier circuit 10 constitute an analog signal detection circuit that detects analog signal level of the output signal VB at the variable gain amplifier circuit 1. According to the first embodiment, the AGC circuit is structured so that the gain of the variable gain amplifier circuit 1 is controlled in accordance with the output signal of the analog signal level detection circuit. However, the applications of the analog signal level detection circuit is not limited only to the AGC circuit but is applicable to various applications.

The characteristics of the second embodiment are as described below. That is, even when the output of the voltage comparator 3 changes within a period shorter than the cycle of the reference clock V9 due to a chattering or external noise, the count operation, which should be primarily performed by the up/down counter 5, is not subject to the influence thereof. Accordingly, the count operation of the up/down counter 5 is stabilized and thus the operation of the variable gain amplifier circuit 1 is stabilized. Therefore, more excellent AGC circuit can be provided.

Figure 5:
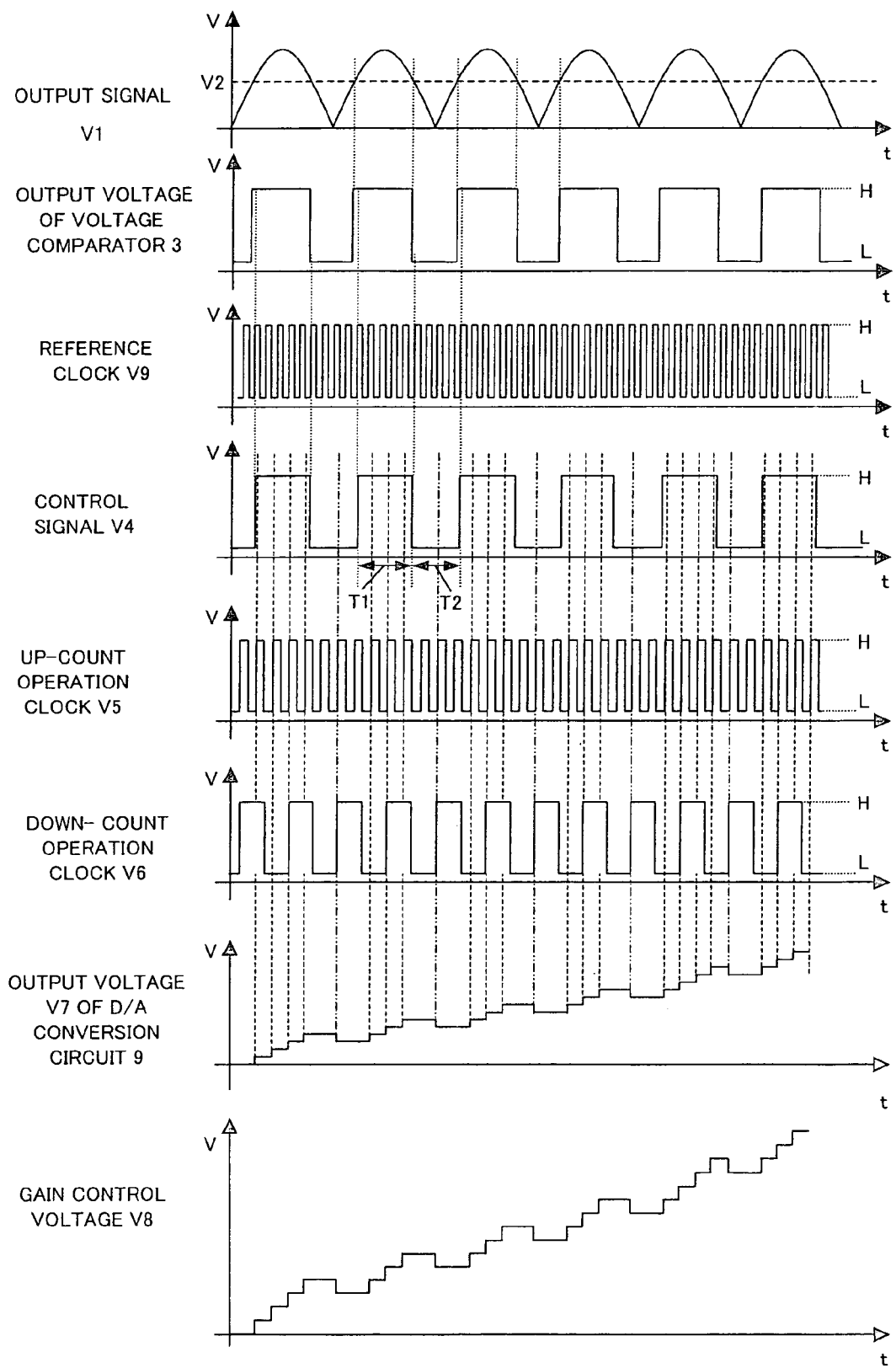
FIG. 5 is a waveform chart illustrating the operation of the AGC circuit shown in FIG. 4.

FIG. 5 is a waveform chart illustrating the operation of the AGC circuit according to the second embodiment. In FIG. 5, the output signal V1 of the rectification circuit 3, the output voltage of the voltage comparator 3, reference clock V9 to be input into the flip-flop 11, control signal V4 to be input into the up/down counter 5, the up-count operation clock V5 to be input into the up/down counter 5, the down-count operation clock V6 to be input into the up/down counter 5, the output voltage V7 of the D/A conversion circuit 9, and the gain control voltage V8 to be input into the variable gain amplifier circuit 1 are shown respectively. Different point from the waveform chart shown in FIG. 2 is that the flip-flop 11 stores the output voltage of the voltage comparator 3 synchronously with the reference clock V9, and the control signal V4 is output from the flip-flop 11. Other than the above is the same as that shown in FIG. 2.

(Third Embodiment)

Figure 6:
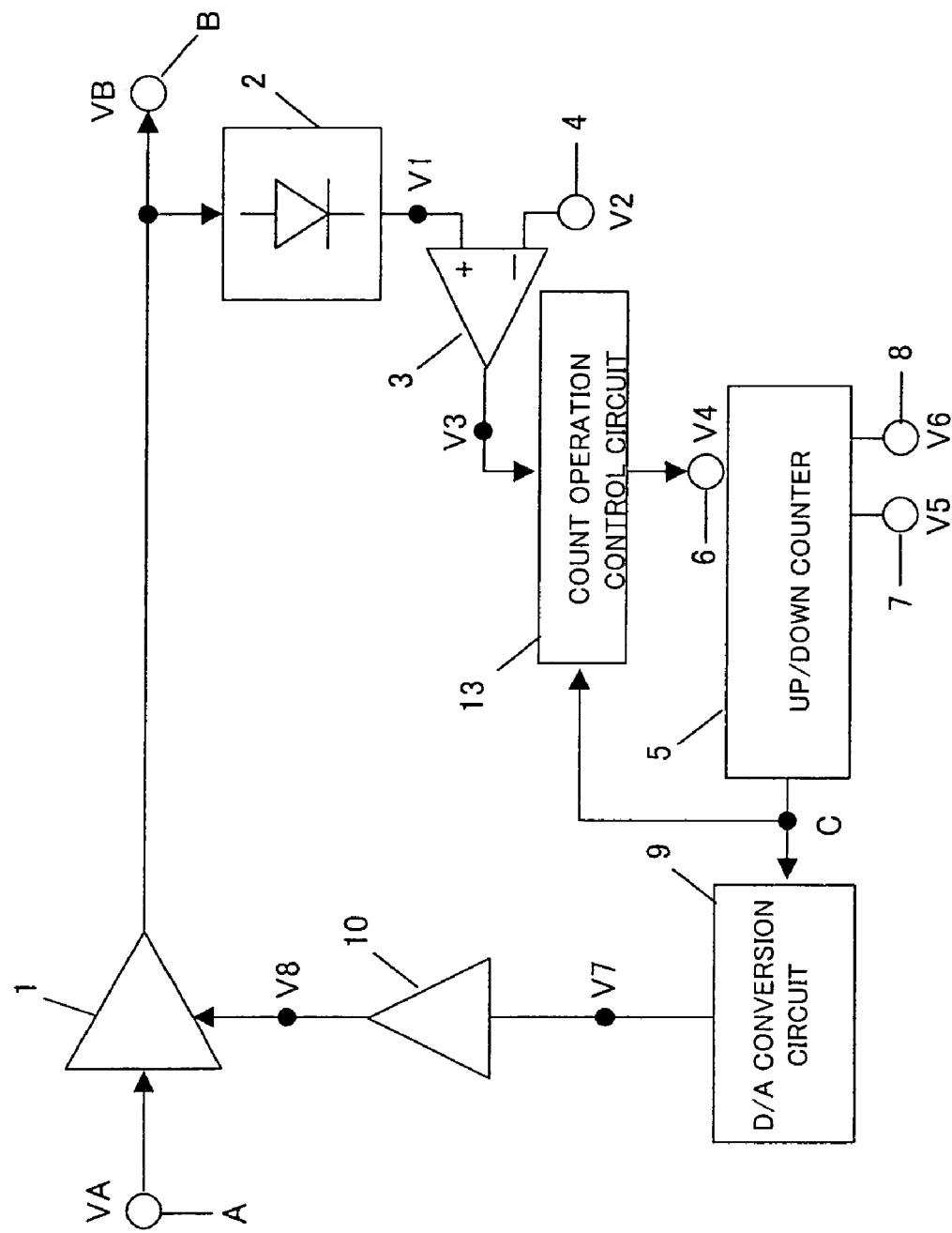
FIG. 6 is a block diagram showing a configuration of an AGC circuit according to a third embodiment of the invention.

FIG. 6 is a block diagram showing the configuration of an AGC circuit of a third embodiment of the invention. In FIG. 6, the constituent elements, which are the same as those in the AGC circuit according to the first embodiment of the invention shown in FIG. 1, will given with the same reference numerals and symbols, and the description thereof will be omitted. Only the elements, which are newly added to the AGC circuit shown in FIG. 1, will be described.

Reference numeral 13 denotes a first count operation control circuit that controls whether to transmit high level or low level voltage V3, which is output from the first voltage comparator 3, to the up/down operation control input terminal 6 or to shut down the transmission of the high level or low level voltage V3 in accordance with the count value C counted by the first up/down counter 5.

To be more precise, when the count value C is smaller than a predetermined upper limit value, the first count operation control circuit 13 transmits the high level voltage V3 to the up/down operation control input terminal 6. When the count value C reaches the predetermined upper limit value, the first count operation control circuit 13 shuts down the high level voltage V3 so as not transmit the voltage to the up/down operation control input terminal 6. Thereby, the up-count operation of the up/down counter 5 is stopped. Even after the count value C has reached the predetermined upper limit value, the low level voltage V3 is transmitted. The reason of this is to allow the up/down counter 5 to perform the down-count operation so as to reduce the count value C from the predetermined upper limit value.

Also, when the count value C is larger than a predetermined lower limit value, the first count operation control circuit 13 transmits the low level voltage V3 to the up/down operation control input terminal 6. When the count value C reaches the predetermined lower limit value, the first count operation control circuit 13 shuts down the low level voltage V3 so as not to transmit the voltage to the up/down operation control input terminal 6. Thereby, the down-count operation of the up/down counter 5 is stopped. Even after the count value C has reached the predetermined lower limit value, the high level voltage V3 is transmitted. The reason of this is to allow the up/down counter 5 to perform the up-count operation so as to increase the count value C from the predetermined lower limit value.

Owing to the control operation of the first count operation control circuit 13 as described above, in the up/down counter 5, the count value C is limited to a value within a range from the predetermined lower limit value to the predetermined upper limit value (including the lower limit value and the upper limit value). The predetermined upper limit value is set to an arbitrary value smaller than the maximum count value of the up/down counter 5. Also, the predetermined lower limit value is set to an arbitrary value larger than the minimum count value (for example, zero). Needless to say, the upper limit value is a value larger than the lower limit value.

In FIG. 6, the rectification circuit 2, voltage comparator 3, count operation control circuit 13, up/down counter 5, D/A conversion circuit 9 and D.C. amplifier circuit 10 constitute an analog signal detection circuit that detects analog signal level of the output signal VB at the variable gain amplifier circuit 1. According to the third embodiment, the AGC circuit is structured so that the gain of the variable gain amplifier circuit 1 is controlled in accordance with the output signal of the analog signal level detection circuit. However, the applications of the analog signal level detection circuit is not limited only to the AGC circuit but various applications thereof are possible.

If any circuit for stopping the count operation of the up/down counter 5 is not provided, the following problem will occur. That is, in the case where the count operation is performed in accordance with the input signal VA, when the count value C reaches the maximum count value or the minimum count value, which depends on the structure of the up/down counter 5, and when the count operation of the same direction is further continued, the maximum count value changes into the minimum count value and the minimum count value changes into the maximum count value. As a result, the gain control voltage V8 changes sharply, and following the change, the output of the variable gain amplifier circuit 1 also changes sharply.

As one of the characteristics of the third embodiment, the above problem can be prevented by setting the upper limit value and the lower limit value of the count value C at random; thereby when the count value C reaches the upper limit value, the up-count operation is stopped; and when the count value C reaches the lower limit value, the down-count operation is stopped. Further, since the upper limit value and the lower limit value of the count value C can be set arbitrarily within a range from the maximum count value and the minimum count value, which depends on the structure of the up/down counter 5, further eminent AGC circuit, which is capable of arbitrarily setting the gain variation range of the variable gain amplifier circuit 1, can be provided.

Figure 7:
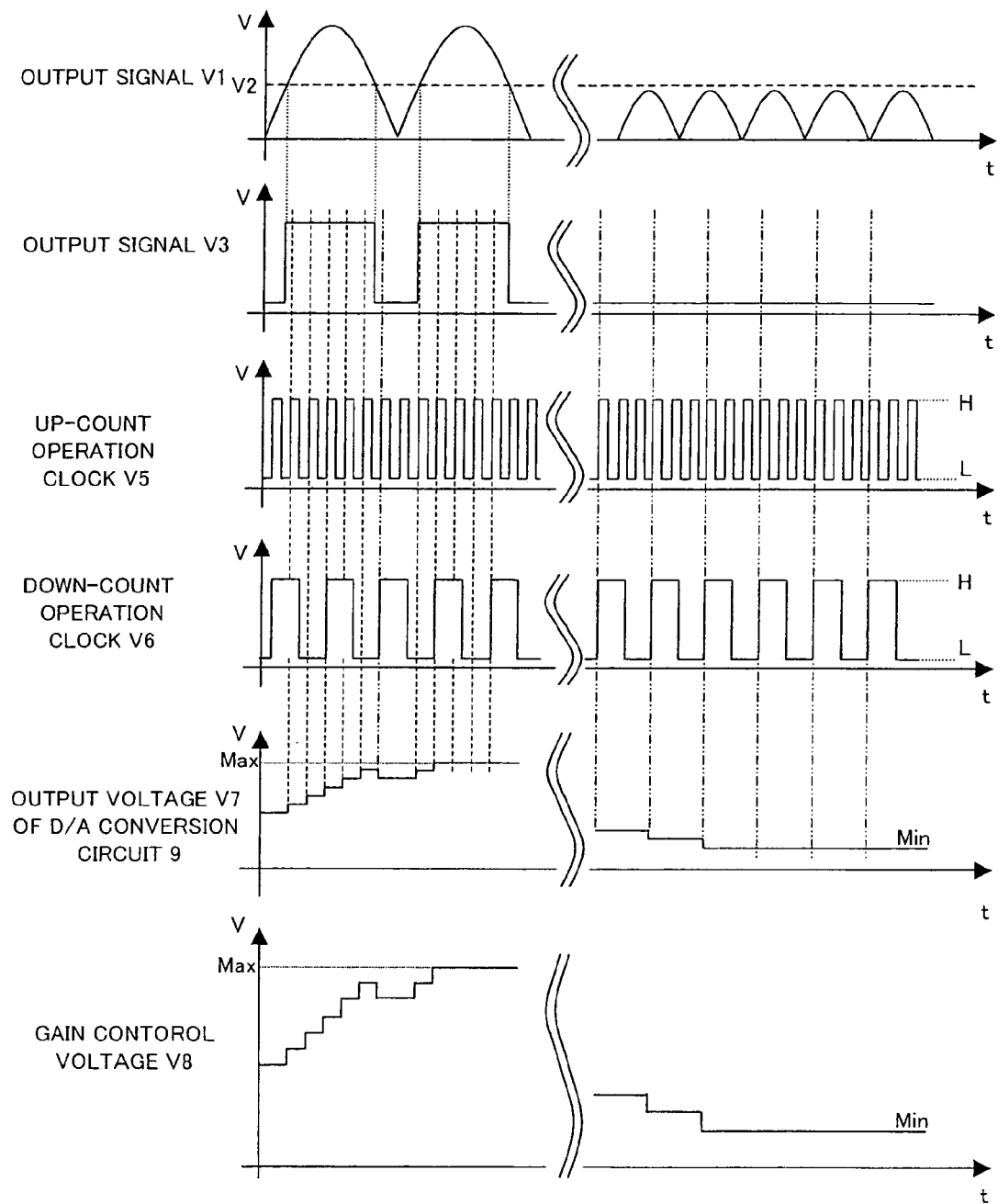
FIG. 7 is a waveform chart illustrating the operation of the AGC circuit shown in FIG. 6.

FIG. 7 is a waveform chart of each section illustrating the operation of the AGC circuit according to the third embodiment. In FIG. 7, the output signal V1 of the rectification circuit 3, the output signal V3 of the voltage comparator 3, the up-count operation clock V5 to be input into the up/down counter 5, the down-count operation clock V6 to be input into the up/down counter 5, the output voltage V7 of the D/A conversion circuit 9, and the gain control voltage V8 to be input into the variable gain amplifier circuit 1 are shown respectively.

In the waveform chart in FIG. 7, the left-half of the chart shows the waveform of each section when the level of the output signal V1 of the rectification circuit 2 is high; the count value C continues to increase; and the up-count operation stops at a point where the count value C has reached the upper limit value; and the increase of the output voltage V7 of the D/A conversion circuit 9 is stopped and is stable at the maximum value. Also, the right-half of the chart shows the waveform of each section when the level of the output signal V1 of the rectification circuit 2 is low; the count value C continues to lower; and the down-count operation stops at a point where the count value C has reached the lower limit value; and the decrease of the output voltage V7 of the D/A conversion circuit 9 is stopped and is stable at the minimum value.

In the above third embodiment, in addition to the up/down counter 5, the count operation control circuit 13 is provided. However, a function equivalent to the count operation control circuit 13 may be included in the up/down counter 5. That is, the function that the up-count operation is executed or stopped, and the down-count operation is executed or stopped according to the count value; thereby the count value is limited within a range between the predetermined upper limit value and the predetermined lower limit value may be incorporated into the first up/down counter 5. To be more precise, the first up/down counter 5 compares the count value with the predetermined upper limit value and the predetermined lower limit value respectively, and based on the comparison result, controls the up-count operation and the down-count operation; thereby, count value is limited within the range between the predetermined upper limit value and the predetermined lower limit value.

Figure 8:
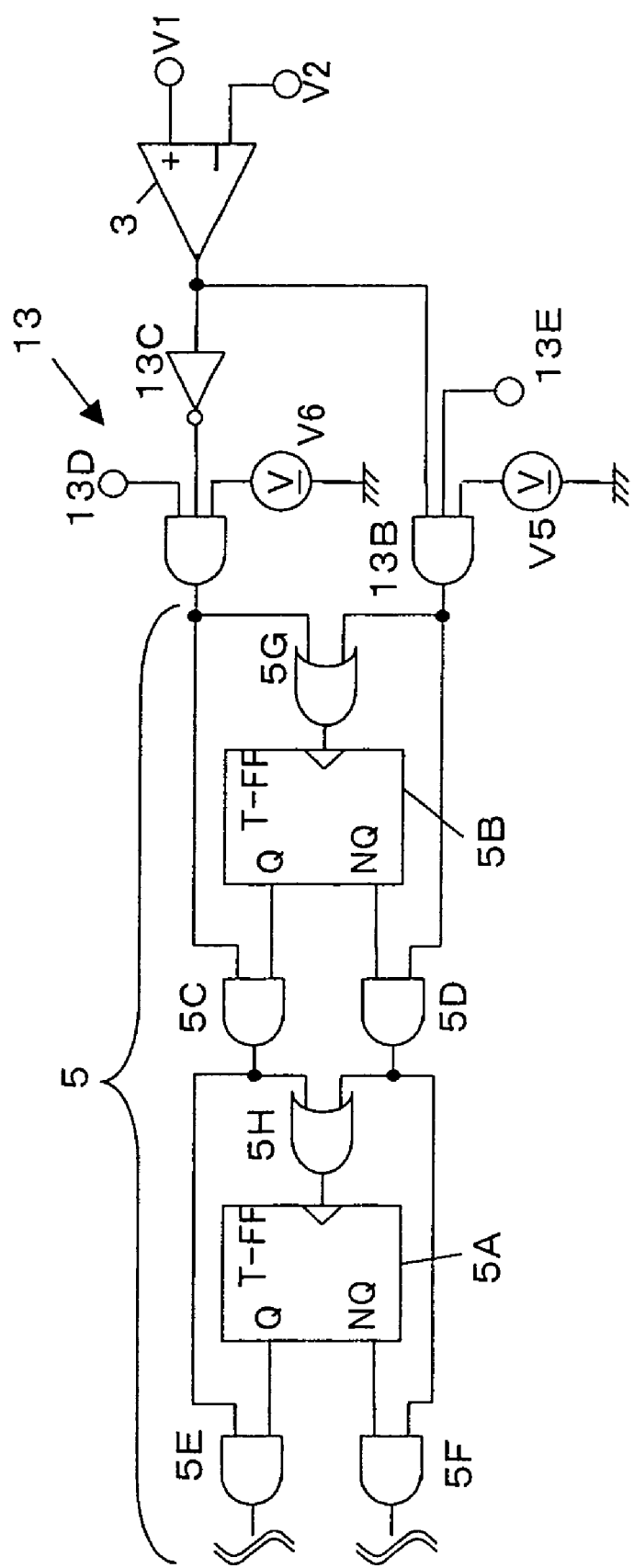
FIG. 8 is a block diagram showing an example of a specific configuration of an up/down counter and a count operation control circuit.

FIG. 8 shows an example of a configuration of a circuit of the count operation control circuit 13 and the up/down counter 5. In FIG. 8, reference numerals 5A and 5B denote a T-flip-flop (or D-flip-flop) respectively; reference numerals 5C–5F denote an AND circuit respectively; and reference numerals 5G and 5H denote an OR circuit respectively. Reference numerals 13A and 13B denote an AND circuit respectively; reference numeral 13C denotes an inverter circuit, reference numeral 13D denotes a terminal to which the low level signal is input when the count value of the up/down counter 5 is the lower limit value; and reference numeral 13E denotes a terminal to which the low level signal is input when the count value of the up/down counter 5 is the upper limit value. In this circuit, AND of the output signal of the voltage comparator 3 and the clock is input as the clock of the up/down counter 5, and it is structured so that, when the count value reaches the upper limit value or the lower limit value, the clock of up-direction or down-direction is prevented from passing through.

Figure 9:
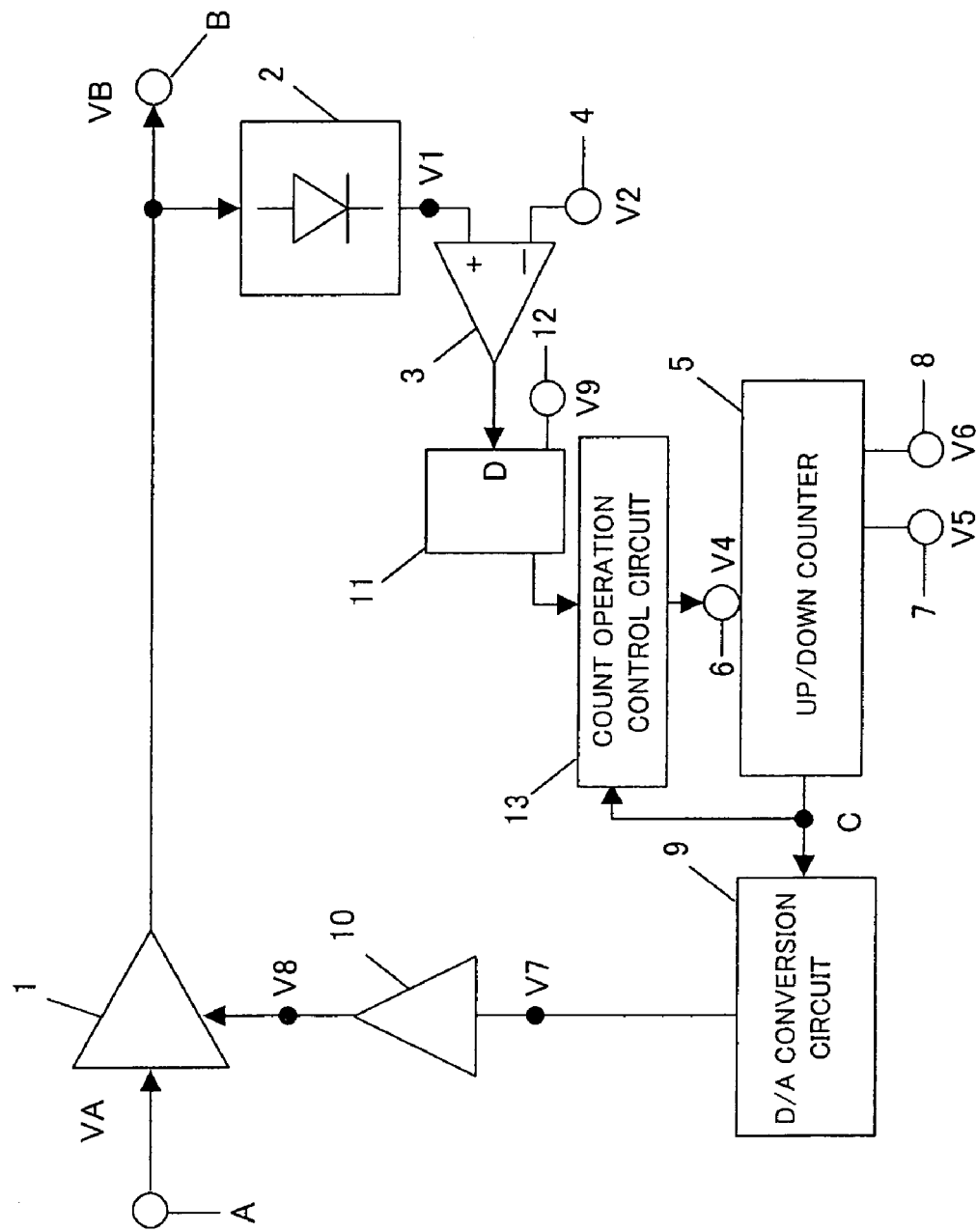
FIG. 9 is a block diagram showing the configuration of an AGC circuit, which is added with a count operation control circuit to the configuration shown in FIG. 4.

Further, the configuration of the count operation control circuit 13, or the configuration, in which the up/down counter 5 includes the circuit equivalent to the count operation control circuit 13, maybe added to the configuration of the AGC circuit according to the second embodiment. In other words, it is easy to combine the configurations of the second embodiment and the third embodiment. When the count operation control circuit 13 is added to the configuration of the second embodiment, as shown in FIG. 9, the count operation control circuit 13 is provided between the flip-flop 11 and the up/down counter 5.

(Fourth Embodiment)

Figure 10:
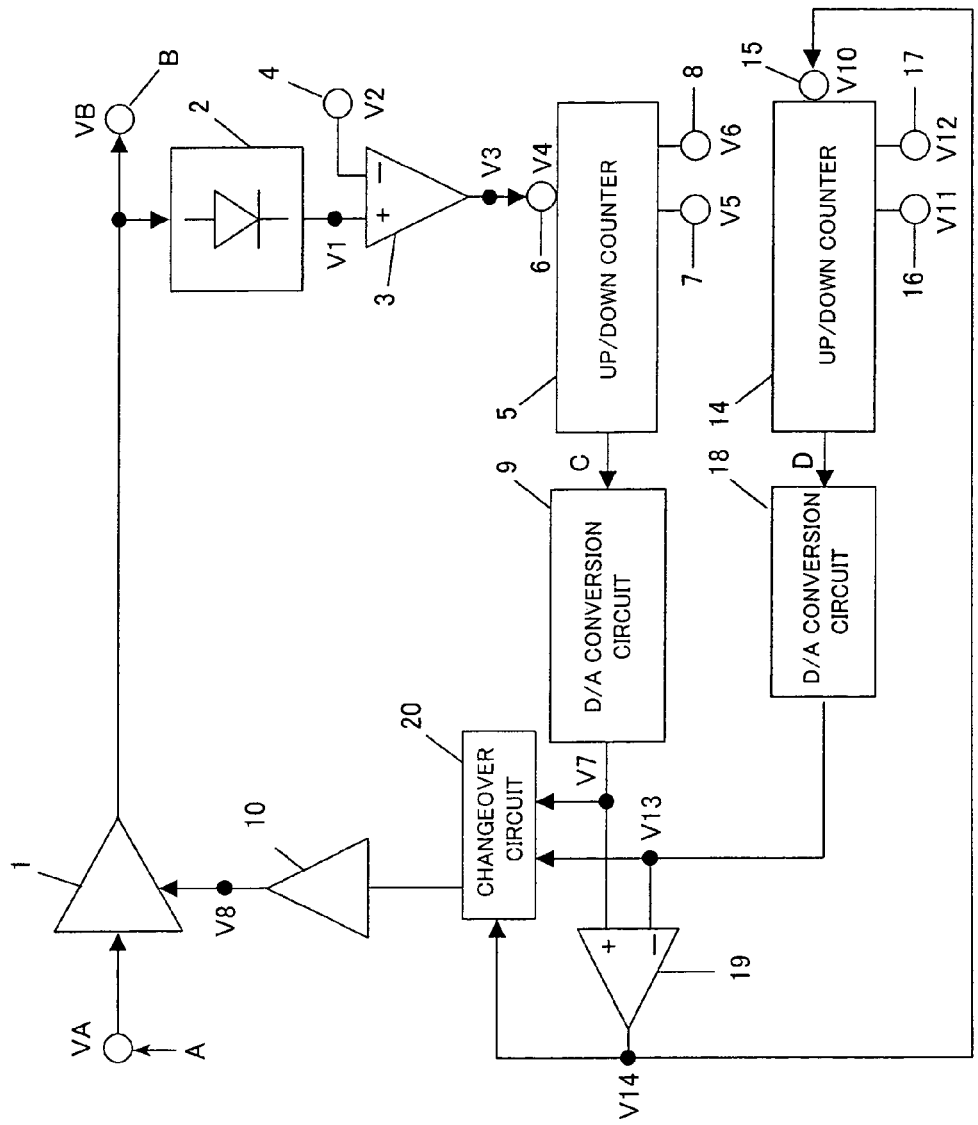
FIG. 10 is a block diagram showing the configuration of an AGC circuit according to a fourth embodiment of the invention.

FIG. 10 is a block diagram showing the configuration of an AGC circuit of a fourth embodiment of the invention. In FIG. 10, the constituent elements, which are the same as those in the AGC circuit according to the first embodiment of the invention shown in FIG. 1, will given with the same reference numerals and symbols, and the description thereof will be omitted. Only the elements, which are newly added to the AGC circuit shown in FIG. 1, will be described.

Reference numeral 14 denotes a second up/down counter. Reference numeral 15 denotes an up/down operation control input terminal for inputting a control signal V10 and thereby controlling the count direction of the second up/down counter 14. Reference numeral 16 denotes an up-count operation clock input terminal for inputting an up-count operation clock V11 into the second up/down counter 14. Reference numeral 17 denotes a down-count operation clock input terminal for inputting a down-count operation clock V12 into the second up/down counter 14.

Reference numeral 18 denotes a second D/A conversion circuit for outputting a D.C. voltage V13 corresponding to a count value D of the second up/down counter 14. Reference numeral 19 denotes a second voltage comparator that compares an output voltage V7 of the first D/A conversion circuit 9 with the output voltage V13 of the second D/A conversion circuit 18. The second voltage comparator 19 outputs a high level or low level voltage V14 corresponding to the comparison result between the voltages V7 and V13, and thereby controls the up/down operation of the second up/down counter 14.

Reference numeral 20 denotes a changeover circuit that, using the voltage V14 as the input, transmits a higher output voltage of the output voltage V7 of the first D/A conversion circuit 9 and the output voltage V13 of the second D/A conversion circuit 18 to the D.C. amplifier circuit 10 corresponding to the level of the voltage V14. The D.C. amplifier circuit 10 amplifies and outputs the higher one of the voltages V7 and V13 as the gain control voltage V8.

In FIG. 10, the rectification circuit 2, voltage comparator 3, up/down counter 5, D/A conversion circuit 9, D.C. amplifier circuit 10, up/down counter 14, D/A conversion circuit 18, voltage comparator 19, and changeover circuit 20 constitute an analog signal detection circuit that detects analog signal level of the output signal VB at the variable gain amplifier circuit 1. According to the first embodiment, the AGC circuit is structured so that the gain of the variable gain amplifier circuit 1 is controlled in accordance with the output signal of the analog signal level detection circuit. However, the applications of the analog signal level detection circuit is not limited only to the AGC circuit but various applications thereof are possible.

The operation of the fourth embodiment of the invention, which is structured as described above, will be described below.

The operation up to the D/A conversion circuit 9 is the same as the operation of the AGC circuit according to the first embodiment of the invention shown in FIG. 1, which has been described in the description of the operation thereof. In the period when the control signal (voltage) V10, which is input into the up/down operation control input terminal 15; i.e., the output voltage V14 of the second voltage comparator 19, is high level, the up/down counter 14 performs the up-count operation in accordance with the up-count frequency, which is set up by the up-count operation clock V11. Further, in the period when the output signal (voltage) V10 is low level, the up/down counter 14 performs the down-count operation in accordance with the down-count frequency, which is set up by the up-count operation clock V12. The count value D counted by the up/down counter 14 is input into the D/A conversion circuit 18. The D/A conversion circuit 18 outputs the D.C. voltage V13 corresponding to the count value D.

A higher voltage of the D.C. voltages V7 and V13 is transferred to the D.C. amplifier circuit 10 by the changeover circuit 20; and is amplified to an arbitrary magnitude by the D.C. amplifier circuit 10 and supplied to the variable gain amplifier circuit 1 as the gain control voltage V8.

Further, the voltage comparator 19 compares the D.C. voltages V7 and V13 to each other. When the D.C. voltage V7 is higher than the D.C. voltage V13, the voltage comparator 19 outputs the high level voltage V14; in the case of the other than the above, the voltage comparator 19 outputs the low level voltage V14. The output voltage V14 is supplied as the control signal V10 for controlling the up/down operation of the up/down counter 14; and as described above, the same is supplied to the changeover circuit 20 as the control signal. As an simplest example of the changeover circuit 20, it is conceivable such structure that, using a transfer gate, when the output of the voltage comparator 19 is high level, the gate of the D.C. voltage V7 is opened; and when the same is low level, the gate of the D.C. voltage V13 is opened to allow each of the signals to pass through.

Owing to the gain control voltage V8, the gain of the variable gain amplifier circuit 1 changes and the input signal VA is amplified or attenuated.

The above operation of the input signal VA is repeated until the amplification and the attenuation by the first or second up/down counter 5 or 14 comes into a balance, and the output voltage VB is converged into a specific amplitude level.

Here, it is assumed that the AGC circuit according to the first embodiment of the invention shown FIG. 1 is used for processing an audio signal.

When the input signal VA becomes smaller from a state where the output signal (voltage) VB is stable at a specific amplitude level, the output signal VB also becomes smaller following the input signal VA. After that, as the up/down counter 5 performs the down-count operation, the gain control voltage V8 becomes smaller and the gain of the variable gain amplifier circuit 1 is raised to return the output signal VB to a specific amplitude level.

However, if the frequency of the down-count operation clock V6 is high, the period of time until the output signal VB returns to the specific amplitude level become shorter following the frequency of the down-count operation clock V6. To describe the above based on the actual voice, when a sound F of smaller amplitude with respect to a sound E is input consecutively after the sound E of a certain amplitude, since the sound F is instantaneously made into the sound E of the same magnitude, such first problem is resulted in; that is, an audio signal of no perspective or realistic sensation but with feeling of strangeness is generated.

In order to avoid the above problem, when the frequency of the down-count operation clock V6 is lowered, in the case where a steep and large sound G like a plosive sound is input in a short period of time in a state that a sound E with a certain amplitude is maintained stable at a specific amplitude by the AGC circuit, on the other hand, the following problem occurs. That is, the up/down counter 5 is made to perform the up-count operation due to the steep large sound G to attenuate the same. Accordingly, also a sound E, which is input successively next to the sound G, becomes smaller following the sound G. After the steep and large sound G has extinguished, the up/down counter 5 performs the down-count operation to return the sound E to the sound with the amplitude before the steep and large sound G is input. However, since the frequency of the down-count operation clock V6 is set at a low level, it takes a long time to return it to the specific amplitude level. As a result, such a second problem occurs; that is, time of a state in which the sound E cannot be heard or is hard to hear becomes longer.

According to the embodiment of the invention shown in FIG. 10, for example, when the frequency of the up-count operation clock V11 and the down-count operation clock V12 of the up/down counter 14 are lowered with respect to the frequency of the up-count operation clock V5 and the down-count operation clock V6 of the up/down counter 5 respectively, in the case where, following a sound E with a certain amplitude, a sound F smaller than the sound E is input, the following operation is performed. That is, before the smaller sound F is input, since the sound E is output stably at a specific amplitude owing to the AGC circuit, the output voltage V7 of the D/A conversion circuit 9 and the output voltage V13 of the D/A conversion circuit 18 are balanced with each other at a substantially same potential. When the smaller sound F is input, the up/down counter 5 performs the down-count operation to lower the output voltage V7 of the D/A conversion circuit 9. When the output voltage V7 is lowered lower than the output voltage V13 of the D/A conversion circuit 18, the output voltage V14 of the voltage comparator 19 inverts from the high level to the low level, and the up/down counter 14 performs the down-count operation to lower the output voltage V13 of the D/A conversion circuit 18. However, since the frequency of the down-count operation clock V12 of the up/down counter 14 is lower than the frequency of the down-count operation clock V6 of the up/down counter 5, the lowering speed of the output voltage V13 becomes slower. Accordingly, the state where the output voltage V13 is higher than the output voltage V7 is maintained, the gain control voltage V8 is generated from the output voltage V13 by the changeover circuit 20. As a result, since the period of time until the sound F is stabilized at specific amplitude by the AGC circuit becomes longer, it is possible to output the audio signal without loosing realistic sensation or perspective with any uncomfortable feeling.

The invention is established when the relationship between the frequency of the up-count operation clock V11 and the down-count operation clock V12 of the up/down counter 14 and the frequency of the up-count operation clock V5 and the down-count operation clock V6 of the up/down counter 5 is inverted.

Further, in a state where the sound E with certain amplitude is kept stable at specific amplitude by the AGC circuit, when a steep and large sound G such as a plosive sound is input in a short period of time, the following operation is performed. That is, the up/down counter 5 performs the up-count operation due to the steep and large sound G, and the output voltage V7 of the D/A conversion circuit 9 is raised; and the up/down counter 14 is also made to perform the up-count operation by the voltage comparator 19 and the output voltage V13 of the D/A conversion circuit 18 is also raised.

However, since the frequency of the up-count operation clock V5 of the up/down counter 5 is higher than the frequency of the up-count operation clock V11 of the up/down counter 14, the output voltage V7 become high earlier than the output voltage V13, the gain of the variable gain amplifier circuit 1 follows the gain control voltage V8 generated from the output voltage V7.

After the sound G has extinguished, when the sound E is returned to the sound with the amplitude before the steep and large sound G is input, the up/down counter 5 performs the down-count operation. However, since the output voltage V7 is higher than the output voltage V13, the up/down counter 14 continues the up-count operation along with the input of the steep and large sound G. After that, the relationship between the voltages V7 and V13 is inverted, and the up/down counter 14 starts the down-count operation.

During the period when the output voltage V7 is higher than the output voltage V13, since the speed that sound E returns to the specific amplitude follows the frequency of the down-count operation clock V6 of the up/down counter 5, the above-described problems can be prevented.

In the above embodiment, in order to prevent the first and second problems, the frequency of the count operation clocks V5, V6, V11 and V12 of the first and second up/down counter 5 and 14 are made to be different from each other. The same effect can be obtained by making the variation range of the count value of the first and second D/A conversion circuits 9 and 18 to be different from each other. For example, by making the variation range of the second D/A conversion circuit 18 to be smaller than the variation range of the first D/A conversion circuit 9.

Figure 11:
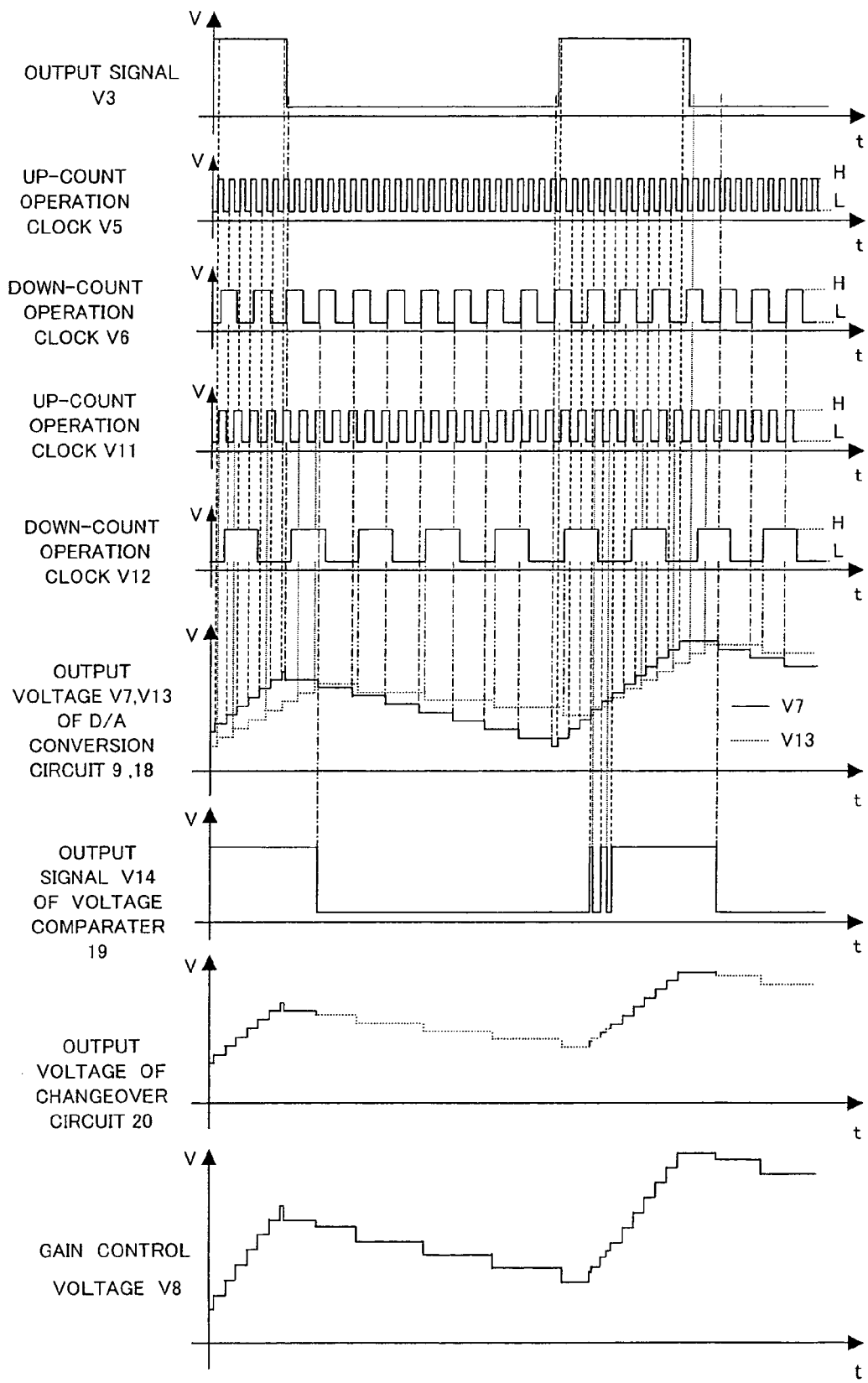
FIG. 11 is a waveform chart illustrating the operation of the AGC circuit shown in FIG. 10.

FIG. 11 is a waveform chart showing the operation of each section of the AGC circuit according to the fourth embodiment. FIG. 11 shows the output signal V3 of the voltage comparator 3, the up-count operation clock V5 to be input into the up/down counter 5, the down-count operation clock V6 to be input into the up/down counter 5, the up-count operation clock V11 to be input into the up/down counter 14, the down-count operation clock V12 to be input into the up/down counter 14, the output voltages V7 and V13 of the D/A conversion circuits 9 and 18 respectively, the output signal V14 of the voltage comparator 19, the output voltage of the changeover circuit 20, and the gain control voltage V8, respectively.

In FIG. 11, it is shown that, in accordance the level of the output signal V14 of the voltage comparator 19, the output voltage V7 and V13 of the D/A conversion circuit 9 and 18 selectively appear as the output voltage of the changeover circuit 20.

Figure 12:
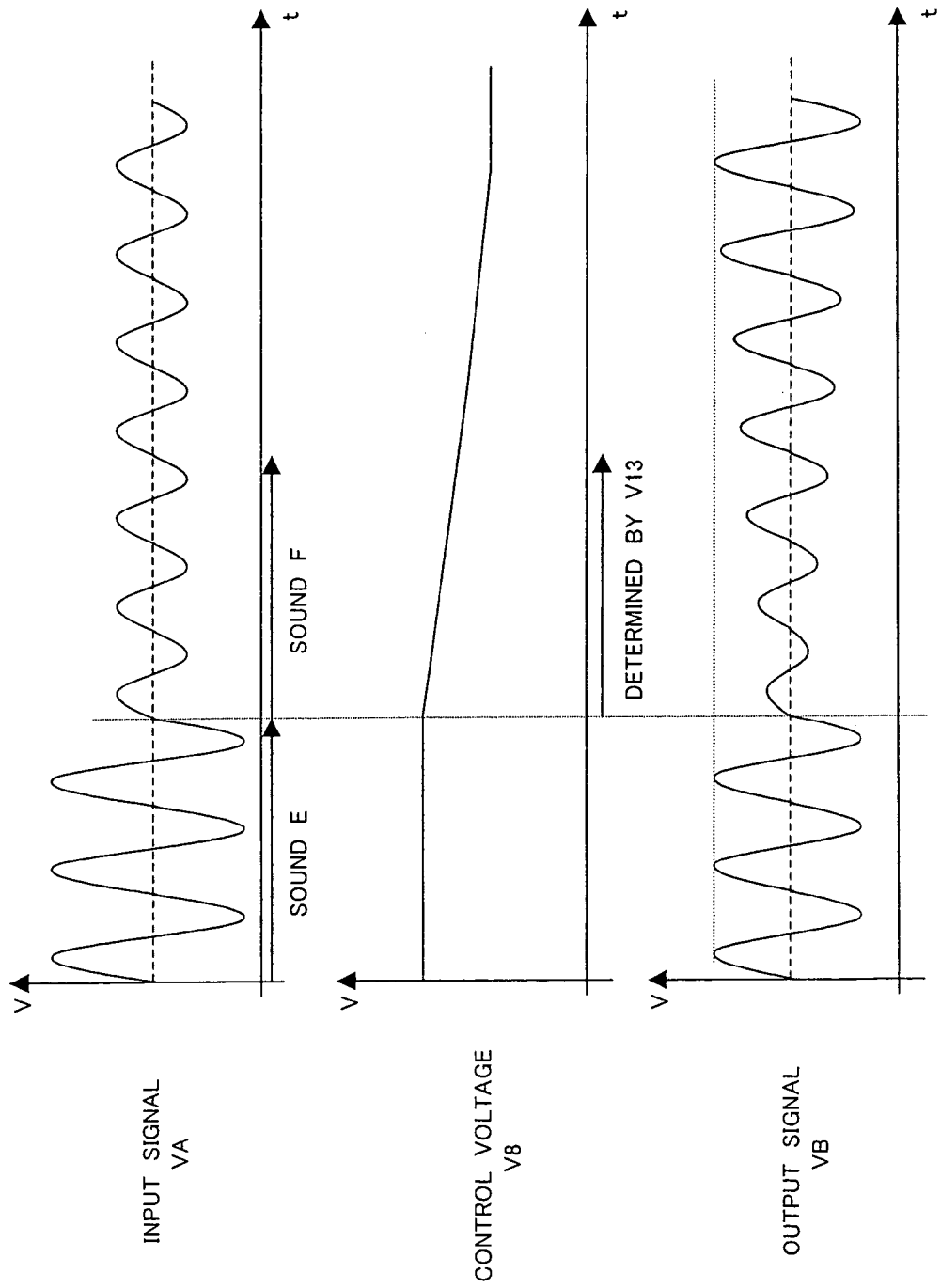
FIG. 12 is also a waveform chart illustrating the operation of the AGC circuit shown in FIG. 10.

In FIG. 12, the waveforms of the input signal VA, the control voltage V8 and the output signal VB in the case a sound F smaller than the sound E is input following the sound E with a certain amplitude are shown more macroscopically than FIG. 11. After the sound F smaller than the sound E is input, the voltage V13 determines the control voltage V8.

Figure 13:
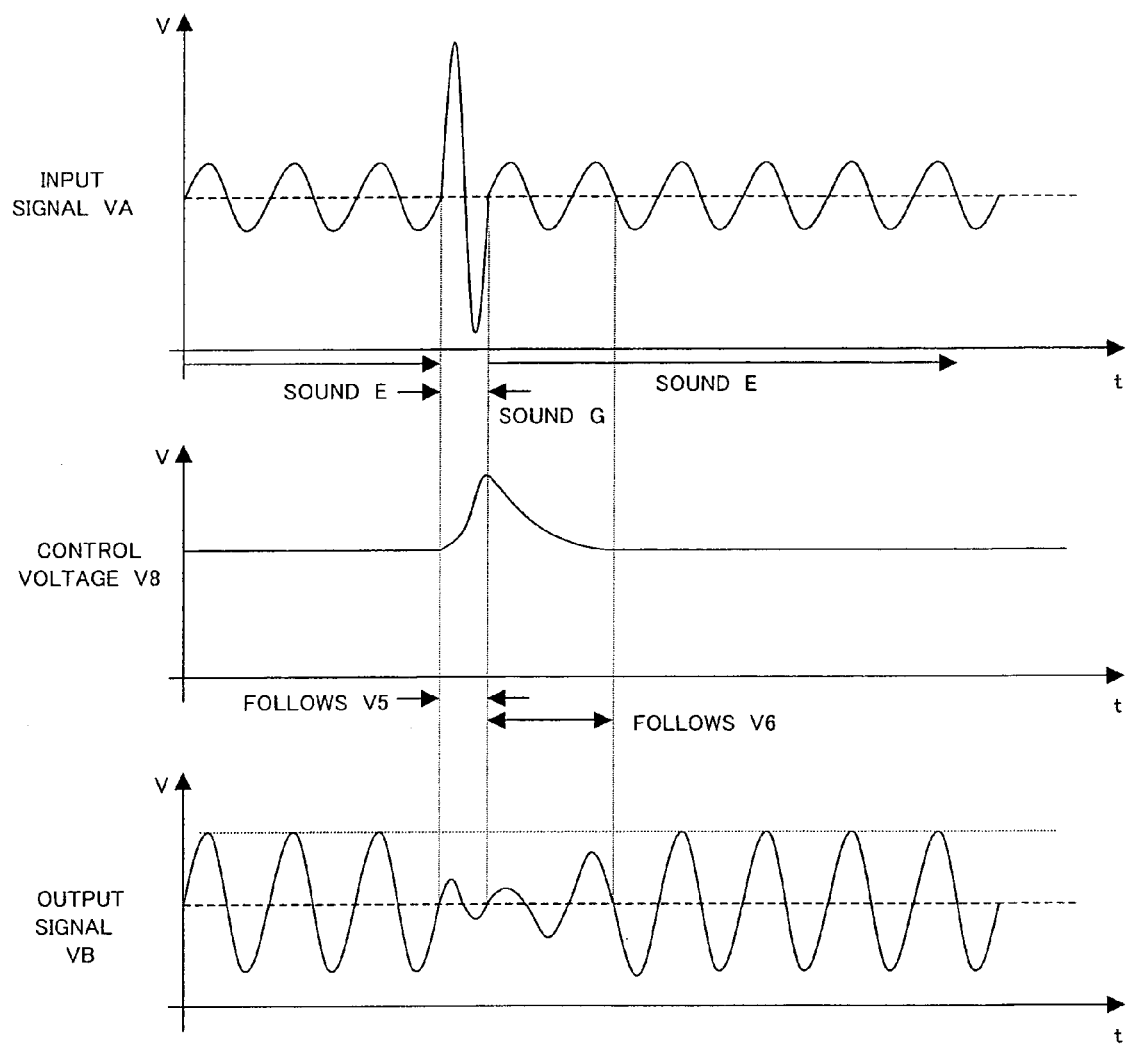
FIG. 13 is also a waveform chart illustrating the operation of the AGC circuit shown in FIG. 10.

In FIG. 13, the waveforms of the input signal VA, the control voltage V8 and the output signal VB, when a steep and large sound G like a plosive sound is input in a short period of time in a state where the sound E with certain amplitude is stable at specific amplitude owing to the AGC circuit, are shown more macroscopically than FIG. 11.

As the embodiments, a configuration in which the flip-flop 11 shown in FIG. 4 is added to the above-described configuration (FIG. 10) of the fourth embodiment, a configuration in which the count operation control circuit 13 shown in FIG. 6 is added thereto, and a configuration a function equivalent to the count operation control circuit 13 is included in the up/down counter 5 are available.

Further, as the embodiments, a configuration in which the flip-flop 11 shown in FIG. 4 and the count operation control circuit 13 shown in FIG. 6 are added to the configuration (FIG. 10) of the fourth embodiment, and a configuration in which in addition to the flip-flop 11, the function equivalent to the count operation control circuit 13 is included in the up/down counter 5 are available.

Furthermore, the configuration (FIG. 10) of fourth embodiment may be added with the flip-flop 11 shown in FIG. 4 and a register having the same configuration as the flip-flop 11 may be provided between the voltage comparator 19 and the up/down counter 14. In this case, in order to eliminate the influence of the output noise of the voltage comparator, it is preferred that the input of the changeover circuit 20 also is input from the register.

Still further, the configuration (FIG. 10) of the fourth embodiment may be added with the count operation control circuit 13 shown in FIG. 6, and a count operation control circuit having the same configuration as the count operation control circuit 13 may be provided between the voltage comparator 19 and the up/down counter 14. Still furthermore, both of the register and the count operation control circuit may be provided between the voltage comparator 19 and the up/down counter 14 in a state where the register is positioned at the voltage comparator 19 side. In this case, in order to eliminate the output noise of the voltage comparator, it is preferred that the input of the changeover circuit 20 is also input from the register.

Figure 14:
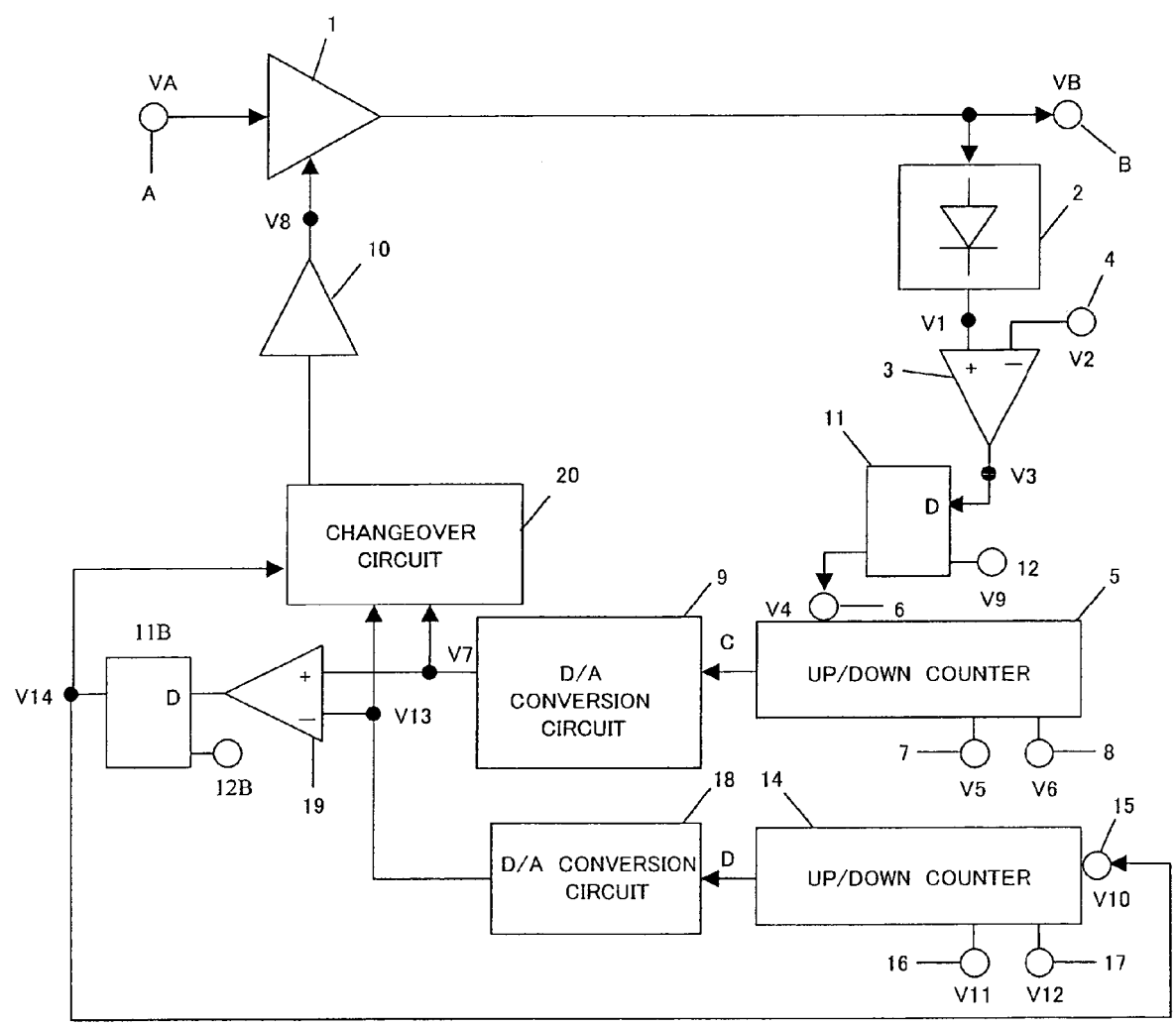
FIG. 14 is a block diagrams showing the configuration of an AGC circuit, which is added with two flip-flops to the configuration shown in FIG. 10.
Figure 15:
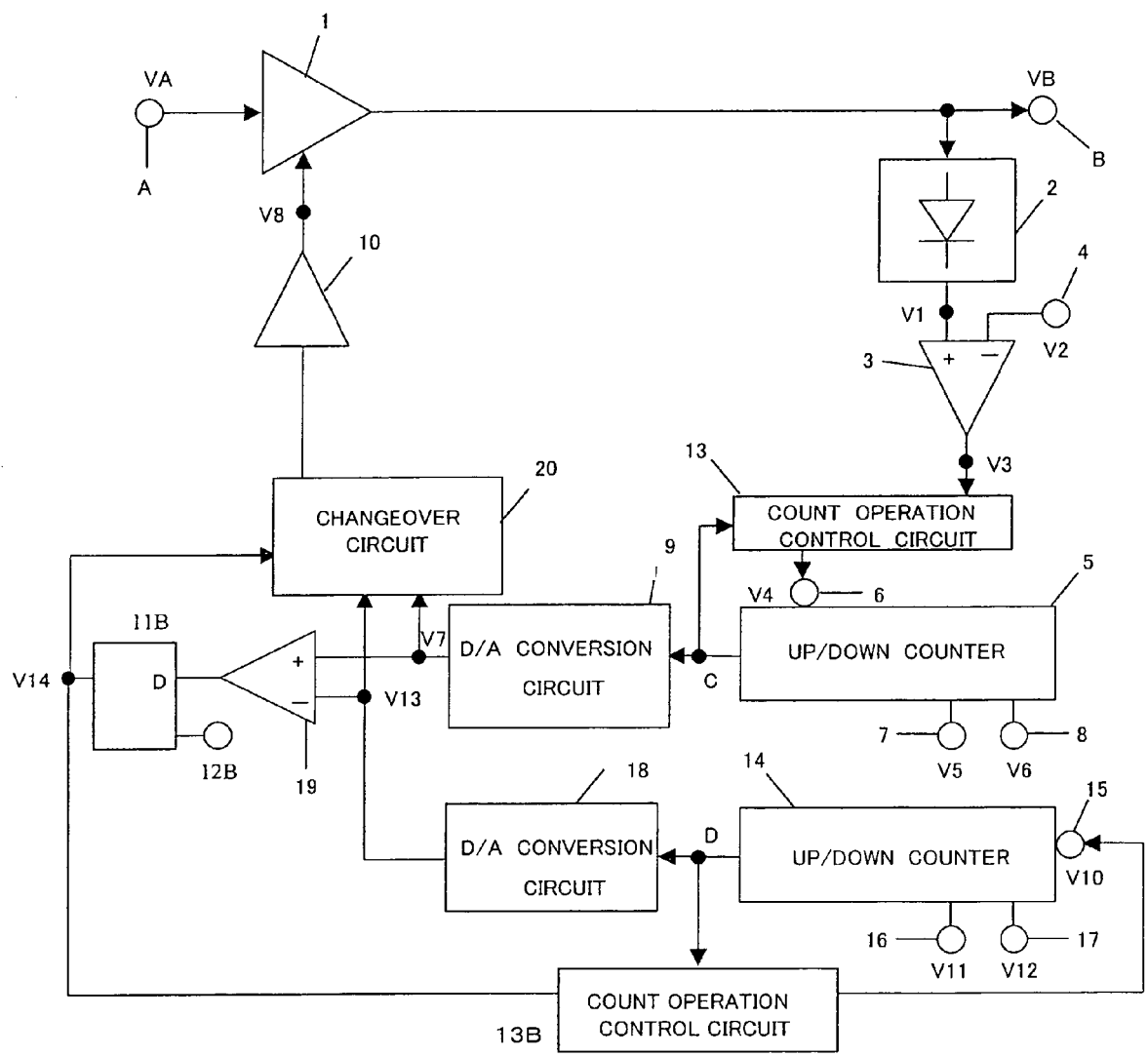
FIG. 15 is also a block diagram showing the configuration of an AGC circuit, which is added with a flip-flop and two count operation control circuits to the configuration shown in FIG. 10.
Figure 16:
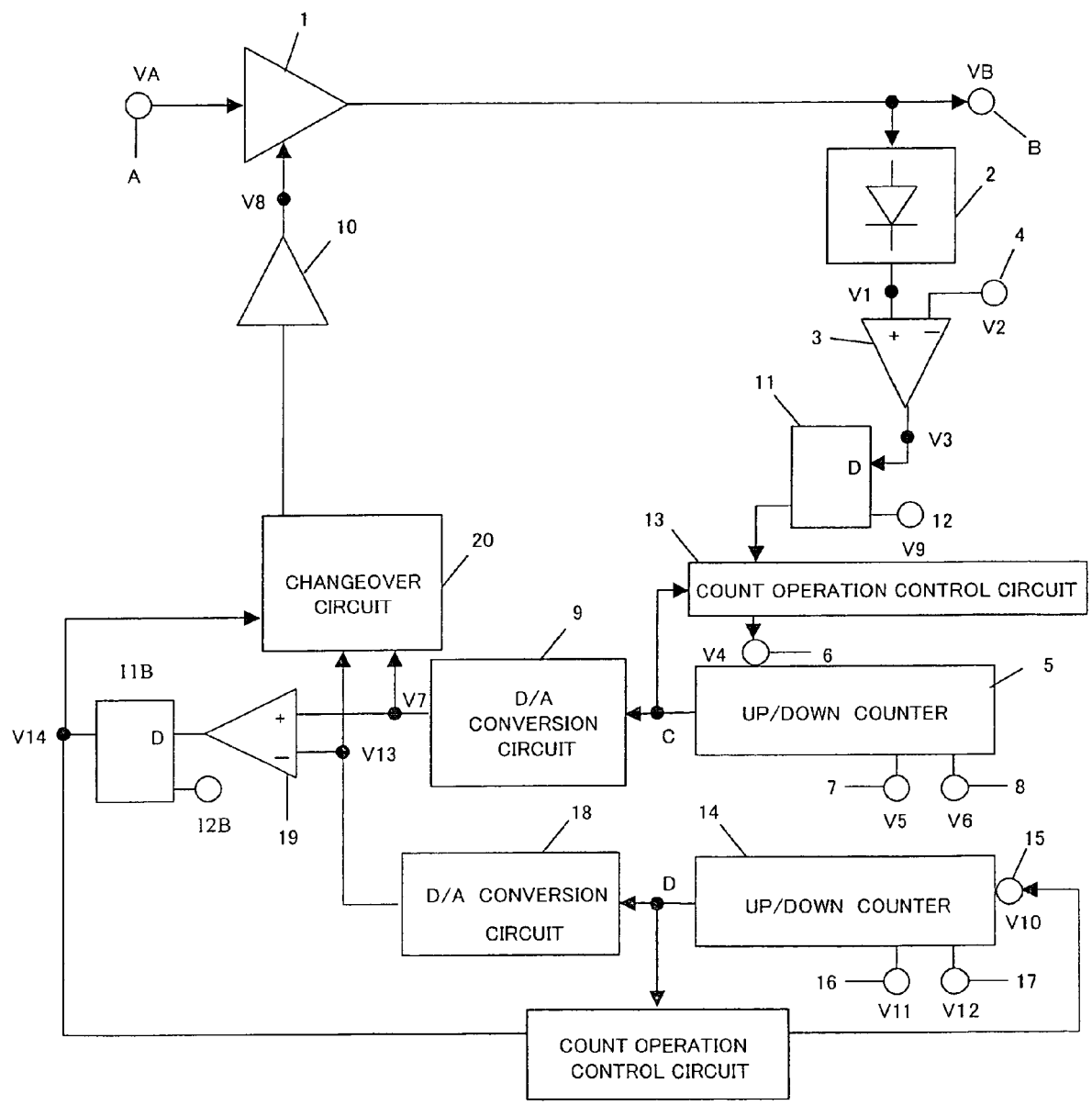
FIG. 16 is a block diagram showing the configuration of an AGC circuit, which is added with two flip-flops and two count operation control circuits to the configuration shown in FIG. 10.
Figure 17:
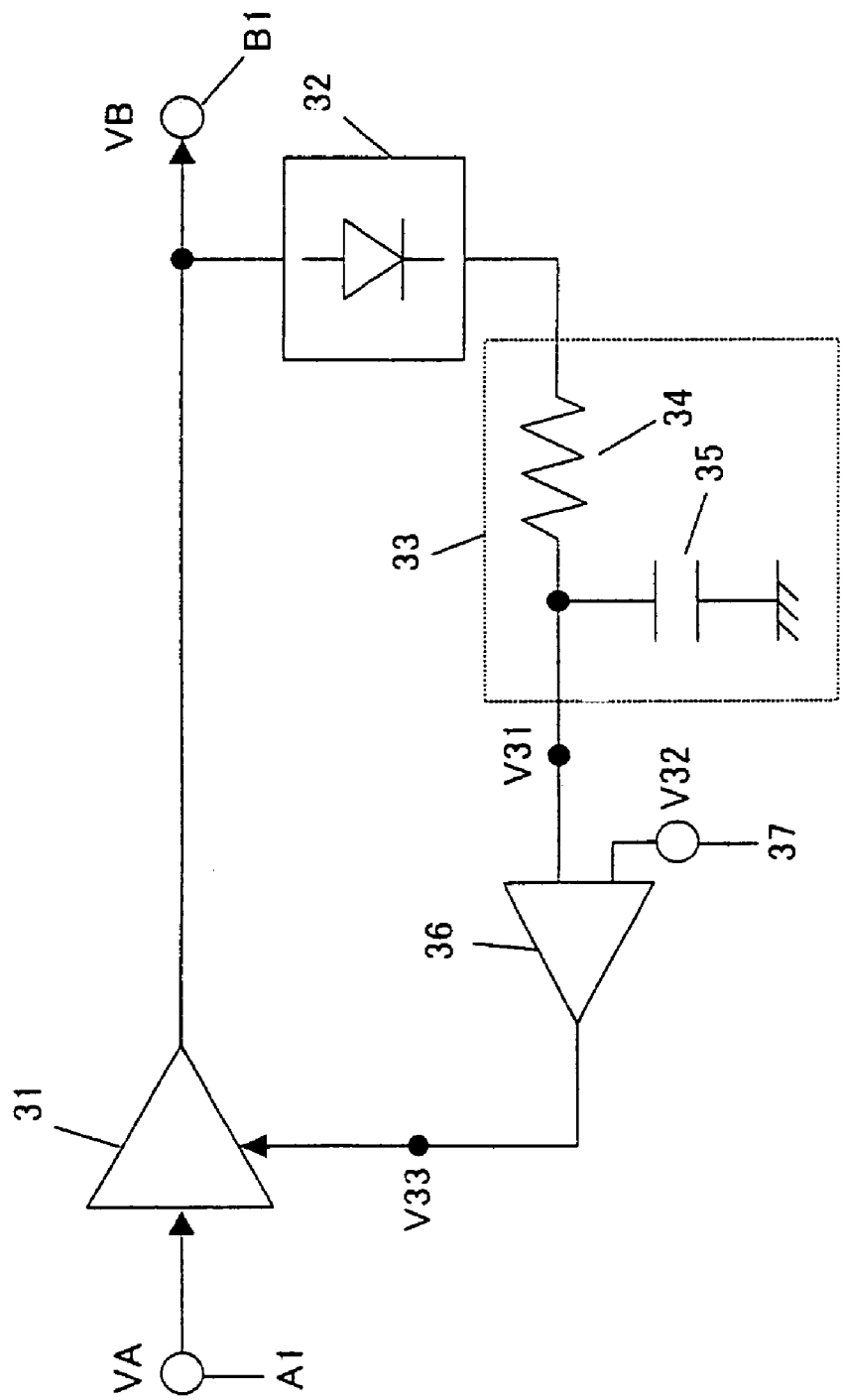
FIG. 17 is a block diagram showing the configuration according to a related art of the AGC circuit.

Here, some of the above-described configurations are shown in FIG. 14, FIG. 15 and FIG. 16. In these drawings, reference numeral 11B denotes a flip-flop, reference numeral 12B denotes a reference clock input terminal and reference numeral 13B denotes a count operation control circuit. The other configuration is the same as that described in the previous embodiments.

Also, in the above embodiments, the configuration in which separate clocks having different frequency respectively for the up-count operation and the down-count operation are input into the up/down counters 5 and 14 is shown. However, the same clock for the up-count operation and the down-count operation may be given. In this case, although the attack time and the recovery time cannot be adjusted separately, the other workings such that the AGC circuit can be achieved without requiring any signal integration circuit using a capacitor etc are the same as those described in the above embodiments.

Although particular embodiments of the invention have been described above, it should be understood that the invention is not limited to those embodiments. A variety of modifications are possible without departing from the technical scope of the invention.

What is claimed is:

1. An AGC circuit comprising:
   a variable gain amplifier circuit that gain controls, in accordance with a gain control signal, an input signal to produce a gain controlled output signal;
   a rectification circuit that rectifies the gain controlled output signal to produce a rectified signal;
   a voltage comparator that compares the rectified signal with a preset voltage to produce a comparator output voltage;
   an up/down counter that switches, in accordance with the comparator output voltage, between an up-count operation and a down-count operation to produce a count value; and a D/A conversion circuit that outputs an analog voltage corresponding to the count value, wherein:

the count value is produced in accordance with first and second clock signals, provided respectively to first and second input terminals of the up/down counter, such that:

when the up-count operation is performed, the up/down counter increments the count value in accordance with the first clock signal; and when the down-count operation is performed, the up/down counter decrements the count value in accordance with the second clock signal, and the gain control signal provided to the variable gain amplifier circuit corresponds to the analog voltage output from the D/A conversion circuit.

2. The AGC circuit of claim 1, wherein the up-count and down-count operations are regulated such that the count value is restricted within a range from an upper limit to a lower limit.

3. An AGC circuit comprising:

a variable gain amplifier circuit that gain controls, in accordance with a gain control signal, an input signal to produce a gain controlled output signal;

a rectification circuit that rectifies the gain controlled output signal to produce a rectified signal;

a voltage comparator that compares the rectified signal with a preset voltage to produce a comparator output voltage;

a register that stores, according to a cycle of a reference clock, the comparator output voltage so as to generate a register output signal that does not reflect changes of the comparator output voltage occurring at times other than a synchronization time of the reference clock;

an up/down counter that switches, in accordance with the register output signal, between an up-count operation and a down-count operation to produce a count value; and a D/A conversion circuit that outputs an analog voltage corresponding to the count value, wherein:

the gain control signal provided to the variable gain amplifier circuit corresponds to the analog voltage output from the D/A conversion circuit.

4. An AGC circuit comprising:

a variable gain amplifier circuit that gain controls, in accordance with a gain control signal, an input signal to produce a gain controlled output signal;

a rectification circuit that rectifies the gain controlled output signal to produce a rectified signal;

a voltage comparator that compares the rectified signal with a preset voltage to produce a comparator output voltage;

a count operation control circuit that conveys or inhibits conveyance of the comparator output voltage in accordance with a count value;

an up/down counter that switches, in accordance with the conveyed comparator output voltage, between an up-count operation and a down-count operation to produce the count value; and a D/A conversion circuit that outputs an analog voltage corresponding to the count value, wherein:

the count operation control circuit controls the conveyance of the comparator output voltage, controlling the up-count and down-count operations, so as to restrict the count value within a range from an upper limit to a lower limit, and the gain control signal provided to the variable gain amplifier circuit corresponds to the analog voltage output from the D/A conversion circuit.

5. An AGC circuit comprising:

a variable gain amplifier circuit that gain controls, in accordance with a gain control signal, an input signal to produce a gain controlled output signal;

a rectification circuit that rectifies the gain controlled output signal to produce a rectified signal;

a voltage comparator that compares the rectified signal with a preset voltage to produce a comparator output voltage;

a register that stores, according to a cycle of a reference clock, the comparator output voltage so as to generate a register output signal that does not reflect changes of the comparator output voltage occurring at times other than a synchronization time of the reference clock;

a count operation control circuit that conveys or inhibits conveyance of the register output signal in accordance with a count value;

an up/down counter that switches, in accordance with the conveyed register output signal, between an up-count operation and a down-count operation to produce the count value; and a D/A conversion circuit that outputs an analog voltage corresponding to the count value, wherein:

the count operation control circuit controls the conveyance of the register output signal, controlling the up-count and down-count operations, so as to restrict the count value within a range from an upper limit to a lower limit, and the gain control signal provided to the variable gain amplifier circuit corresponds to the analog voltage output from the D/A conversion circuit.

6. An AGC circuit comprising:

a variable gain amplifier circuit that gain controls, in accordance with a gain control signal, an input signal to produce a gain controlled output signal;

a rectification circuit that rectifies the gain controlled output signal to produce a rectified signal;

a first voltage comparator that compares the rectified signal with a preset voltage to produce a first comparator output voltage;

a first up/down counter that switches, in accordance with the first comparator output voltage, between an up-count operation and a down-count operation to produce a first count value;

a first D/A conversion circuit that outputs a first analog voltage corresponding to the first count value;

a second up/down counter that switches, in accordance with a control signal, between an up-count operation and a down-count operation to produce a second count value;

a second D/A conversion circuit that outputs a second analog voltage corresponding to the second count value;

a second voltage comparator that compares the first and second analog voltages to produce the control signal; and a changeover circuit that selects, based on the control signal, the one of the first and second analog signals having the greater voltage, wherein the gain control signal provided to the variable gain amplifier circuit corresponds to the selected one of the first and second analog signals output from the changeover circuit.

7. The AGC circuit of claim 6, wherein:
a first up-count operation clock and a first down-count operation clock are input separately to the first up/down counter; and
a second up-count operation clock and a second down-count operation clock are input separately to the second up/down counter.

8. The AGC circuit of claim 6, further comprising:
a first register that stores, according to a cycle of a first reference clock, the first comparator output voltage so as to generate a first register output signal that does not reflect changes of the first comparator output voltage occurring at times other than a synchronization time of the first reference clock, wherein:
the first up/down counter switches, in accordance with the first register output signal, between the up-count operation and the down-count operation to produce the first count value.

9. The AGC circuit of claim 8, further comprising:
a second register that stores, according to a cycle of a second reference clock, the control signal so as to generate a second register output signal that does not reflect changes of the control signal occurring at times other than a synchronization time of the second reference clock, wherein:
the second up/down counter switches, in accordance with the second register output signal, between the up-count operation and the down-count operation to produce the second count value.

10. The AGC circuit of claim 9, further comprising:
a first count operation control circuit that, in accordance with the first count value, conveys or inhibits conveyance of the first register output signal to the first up/down counter so as to regulate the up-count and down-count operations of the first up/down counter in accordance with the conveyed first register output signal; and
a second count operation control circuit that, in accordance with the second count value, conveys or inhibits conveyance of the second register output signal to the second up/down counter so as to regulate the up-count and down-count operations of the second up/down counter in accordance with the conveyed second register output signal, wherein:
the first count operation control circuit controls the conveyance of the first register output signal, controlling the up-count and down-count operations of the first up/down counter, so as to restrict the first count value within a range from a first upper limit to a first lower limit, and
the second count operation control circuit controls the conveyance of the second register output signal, controlling the up-count and down-count operations of the second up/down counter, so as to restrict the second count value within a range from a second upper limit to a second lower limit.

11. The AGC circuit of claim 1, further comprising:
a first count operation control circuit that, in accordance with the first count value, conveys or inhibits conveyance of the first comparator output voltage to the first up/down counter so as to regulate the up-count and down-count operations of the first up/down counter in accordance with the conveyed first comparator output voltage; and
a second count operation control circuit that, in accordance with the second count value, conveys or inhibits conveyance of the control signal to the second up/down counter so as to regulate the up-count and down-count operations of the second up/down counter in accordance with the conveyed control signal, wherein:
the first count operation control circuit controls the conveyance of the first comparator output voltage, controlling the up-count and down-count operations of the first up/down counter, so as to restrict the first count value within a range from a first upper limit to a first lower limit, and
the second count operation control circuit controls the conveyance of the control signal, controlling the up-count and down-count operations of the second up/down counter, so as to restrict the second count value within a range from a second upper limit to a second lower limit.

12. The AGC circuit of claim 6, wherein:
the up-count and down-count operations of the first up/down counter are regulated such that the first count value is restricted within a range from a first upper limit to a first lower limit; and
the up-count and down-count operations of the second up/down counter are regulated such that the second count value is restricted within a range from a second upper limit to a second lower limit.

* * * * *